United States Patent
Kim et al.

(10) Patent No.: US 10,861,911 B2
(45) Date of Patent: Dec. 8, 2020

(54) LIGHT-EMITTING DISPLAY DEVICE AND METHOD OF MANUFACTURING THE SAME

(71) Applicant: LG Display Co., Ltd., Seoul (KR)

(72) Inventors: Dongyoung Kim, Paju-si (KR); Yucheol Yang, Paju-si (KR); Yongbaek Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 26 days.

(21) Appl. No.: 16/228,549

(22) Filed: Dec. 20, 2018

(65) Prior Publication Data

US 2019/0198590 A1  Jun. 27, 2019

(30) Foreign Application Priority Data

Dec. 22, 2017  (KR) .................. 10-2017-0178332

(51) Int. Cl.
*H01L 27/32* (2006.01)
*H01L 51/50* (2006.01)
*H01L 51/52* (2006.01)

(52) U.S. Cl.
CPC ...... *H01L 27/3246* (2013.01); *H01L 51/5044* (2013.01); *H01L 51/5253* (2013.01); *H01L 51/5284* (2013.01); *H01L 27/322* (2013.01); *H01L 51/5218* (2013.01); *H01L 51/5278* (2013.01); *H01L 2227/323* (2013.01); *H01L 2251/5315* (2013.01)

(58) Field of Classification Search
None
See application file for complete search history.

(56) References Cited

U.S. PATENT DOCUMENTS

| | | | | |
|---|---|---|---|---|
| 8,081,286 B2* | 12/2011 | Kim | ............... | G02F 1/13394 |
| | | | | 349/106 |
| 8,350,994 B1* | 1/2013 | Kim | ............ | G02F 1/136227 |
| | | | | 349/110 |
| 2004/0119398 A1* | 6/2004 | Koo | ............... | H01L 51/5271 |
| | | | | 313/499 |
| 2007/0064179 A1* | 3/2007 | Park | ............. | G02F 1/136209 |
| | | | | 349/110 |
| 2011/0031500 A1 | 2/2011 | Suh | | |
| 2014/0199797 A1 | 7/2014 | Moon et al. | | |

(Continued)

FOREIGN PATENT DOCUMENTS

KR   10-2017-0014043 A   2/2017

OTHER PUBLICATIONS

Combined Search and Examination Report dated May 24, 2019, in corresponding GB Application No. 1820580.7.

(Continued)

*Primary Examiner* — Shaun M Campbell
(74) *Attorney, Agent, or Firm* — Morgan, Lewis & Bockius LLP

(57) ABSTRACT

A light-emitting display device and method of manufacturing the same are provided. A light-emitting display device includes: a first substrate, an insulating layer on the first substrate, the insulating layer including depressions and protrusions, a plurality of light-emitting diodes on the protrusions, the light-emitting diodes including: a pixel electrode layer, an emission layer, and a common electrode layer, and a black matrix layer in the depressions.

19 Claims, 25 Drawing Sheets

(56) References Cited

U.S. PATENT DOCUMENTS

| | | | | |
|---|---|---|---|---|
| 2014/0332778 A1* | 11/2014 | Ito | ........................ | H01L 27/3258 |
| | | | | 257/40 |
| 2016/0118451 A1* | 4/2016 | Youn | ................... | H01L 27/3262 |
| | | | | 257/40 |
| 2016/0233278 A1* | 8/2016 | Yoon | ................... | H01L 27/3246 |
| 2018/0061907 A1* | 3/2018 | Kim | ....................... | H01L 27/322 |

OTHER PUBLICATIONS

The First Office Action dated Oct. 12, 2020, issued in corresponding Indian Patent Application No. 201814046784.

* cited by examiner

LIGHT-EMITTING DISPLAY DEVICE AND METHOD OF MANUFACTURING THE SAME

CROSS-REFERENCE TO RELATED APPLICATION(S)

This application claims the benefit of and priority to Korean Patent Application No. 10-2017-0178332, filed on Dec. 22, 2017, the entirety of which is hereby incorporated by reference.

BACKGROUND

1. Technical Field

The present disclosure relates to a light-emitting display device and a method of manufacturing the same.

2. Discussion of the Related Art

With the development of information technology, the market for display devices that serve as media between users and information is growing. Accordingly, display devices, such as an organic light-emitting diode (OLED) display, a liquid crystal display (LCD), and a plasma display panel (PDP), are increasingly used.

Among the aforementioned display devices, the OLED display device includes a display panel including a plurality of subpixels, a driver for driving the display panel, and a power supply for supplying power to the display panel. The driver includes a scan driver for supplying scan signals (or gate signals) to the display panel and a data driver for supplying data signals to the display panel.

OLED display devices display images in such a manner that light-emitting diodes of selected subpixels emit light when scan signals and data signals are supplied to subpixels arranged in a matrix. OLED display devices can be classified into a bottom emission type that emits light toward a lower substrate, and a top emission type that emits light toward an upper substrate.

OLED display devices have various advantages because they display images based on light generated from LEDs included in subpixels, and thus are spotlighted as future display devices. However, to realize ultra-high definition OLED display devices, more research needs to be conducted.

SUMMARY

Accordingly, the present disclosure is directed to a light-emitting display device and a method of manufacturing the same that substantially obviate one or more of the issues due to limitations and disadvantages of the related art.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts as embodied and broadly described, there is provided a light-emitting display device, including: a first substrate, an insulating layer on the first substrate, the insulating layer including depressions and protrusions, a plurality of light-emitting diodes on the protrusions, the light-emitting diodes including: a pixel electrode layer, an emission layer, and a common electrode layer, and a black matrix layer in the depressions.

In another aspect, there is provided a method of manufacturing a light-emitting display device, the method including: providing a first substrate, providing an insulating layer on the first substrate, the insulating layer including depressions and protrusions, providing a plurality of light-emitting diodes on the protrusions, the providing the light-emitting diodes including: providing a pixel electrode layer, providing an emission layer, and providing a common electrode layer, and providing a black matrix layer in the depressions.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with embodiments of the disclosure. It is to be understood that both the foregoing general description and the following detailed description of the present disclosure are examples and explanatory, and are intended to provide further explanation of the disclosure as claimed.

BRIEF DESCRIPTION OF THE DRAWINGS

The accompanying drawings, that may be included to provide a further understanding of the disclosure and are incorporated in and constitute a part of this specification, illustrate embodiments of the disclosure and together with the description serve to explain various principles of the disclosure.

Figure 1:
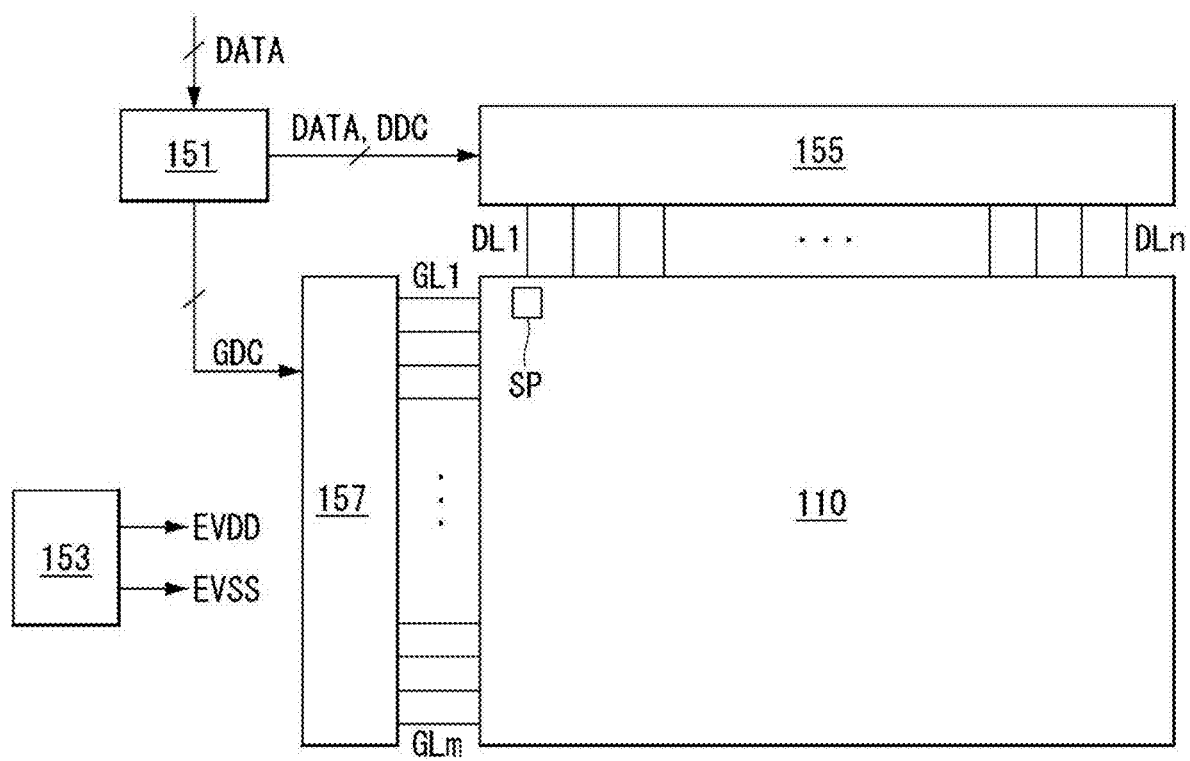
FIG. 1 is a block diagram of an organic light-emitting display device.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present disclosure, examples of which may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments are provided so that this disclosure may be sufficiently thorough and complete to assist those skilled in the art to fully understand the scope of the present disclosure. Further, the present disclosure is only defined by scopes of claims.

A shape, a size, a ratio, an angle, and a number disclosed in the drawings for describing embodiments of the present disclosure are merely an example. Thus, the present disclosure is not limited to the illustrated details. Like reference numerals refer to like elements throughout. In the following description, when the detailed description of the relevant known function or configuration is determined to unnecessarily obscure an important point of the present disclosure, the detailed description of such known function or configuration may be omitted. In a case where terms "comprise," "have," and "include" described in the present specification are used, another part may be added unless a more limiting term, such as "only," is used. The terms of a singular form may include plural forms unless referred to the contrary.

In construing an element, the element is construed as including an error or tolerance range even where no explicit description of such an error or tolerance range. In describing a position relationship, when a position relation between two parts is described as, for example, "on," "over," "under," or "next," one or more other parts may be disposed between the two parts unless a more limiting term, such as "just" or "direct(ly)," is used.

In describing a time relationship, when the temporal order is described as, for example, "after," "subsequent," "next," or "before," a case which is not continuous may be included unless a more limiting term, such as "just," "immediate(ly)," or "direct(ly)," is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms like "first," "second," "A," "B," "(a)," and "(b)" may be used. These terms are merely for differentiating one element from another element, and the essence, sequence, order, or number of a corresponding element should not be limited by the terms. Also, when an element or layer is described as being "connected," "coupled," or "adhered" to another element or layer, the element or layer can not only be directly connected or adhered to that other element or layer, but also be indirectly connected or adhered to the other element or layer with one or more intervening elements or layers "disposed" between the elements or layers, unless otherwise specified.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

In the description of embodiments, when a structure is described as being positioned "on or above" or "under or below" another structure, this description should be construed as including a case in which the structures contact each other as well as a case in which a third structure is disposed therebetween. The size and thickness of each element shown in the drawings are given merely for the convenience of description, and embodiments of the present disclosure are not limited thereto.

Features of various embodiments of the present disclosure may be partially or overall coupled to or combined with each other, and may be variously inter-operated with each other and driven technically as those skilled in the art can sufficiently understand. Embodiments of the present disclosure may be carried out independently from each other, or may be carried out together in co-dependent relationship.

Hereinafter, example embodiments of the present disclosure will be described in detail with reference to the accompanying drawings.

A display device described below is applicable to any spontaneous emission type display device based on spontaneous emission type elements capable of emitting light. For example, the display device described below is applicable to inorganic light-emitting display devices realized based on an inorganic LED, as well as organic light-emitting display devices realized based on an OLED. However, an organic light-emitting display device is used as an example device in the following description.

Figure 2:
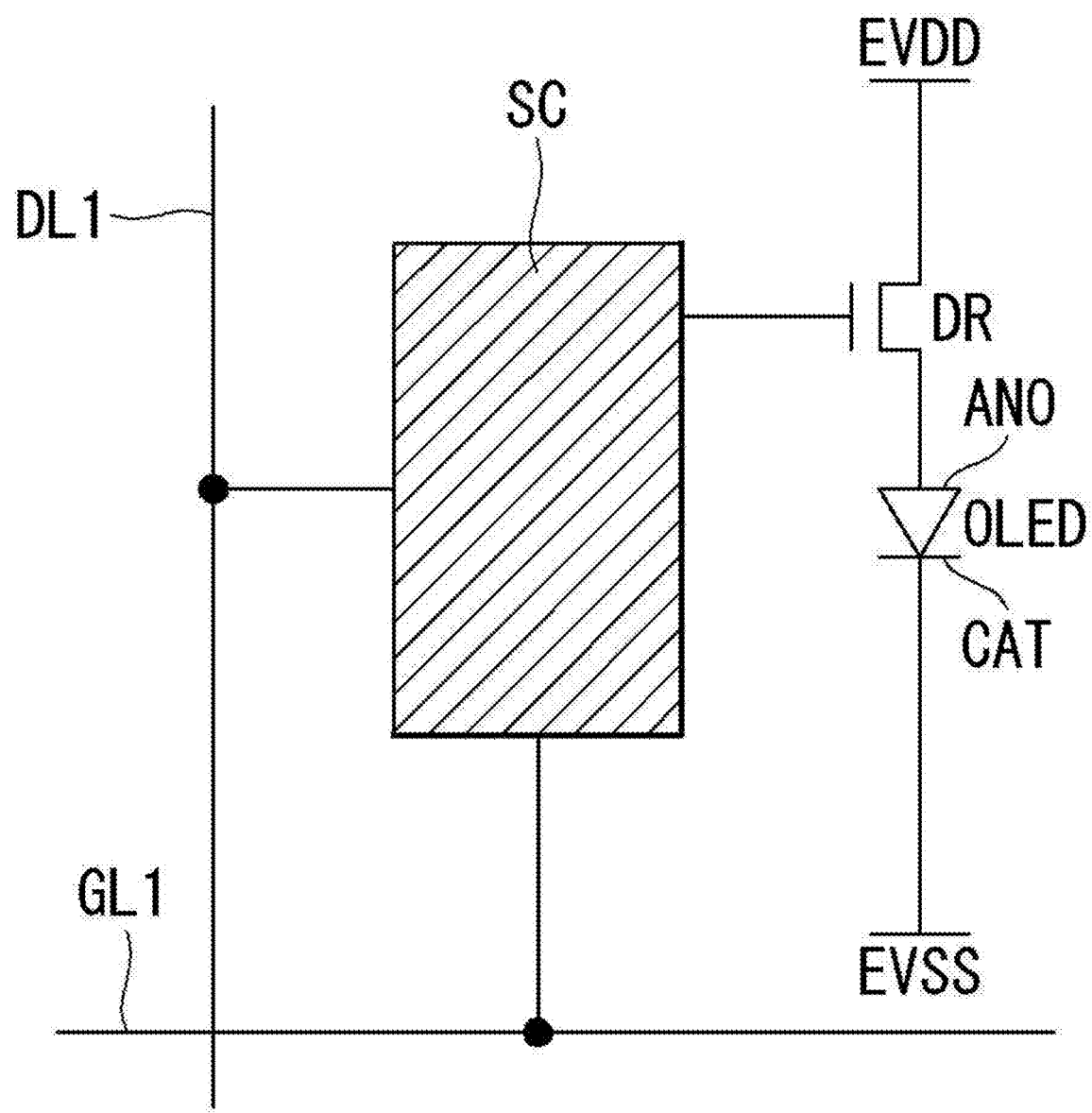
FIG. 2 is a circuit diagram of a subpixel.
Figure 3A:
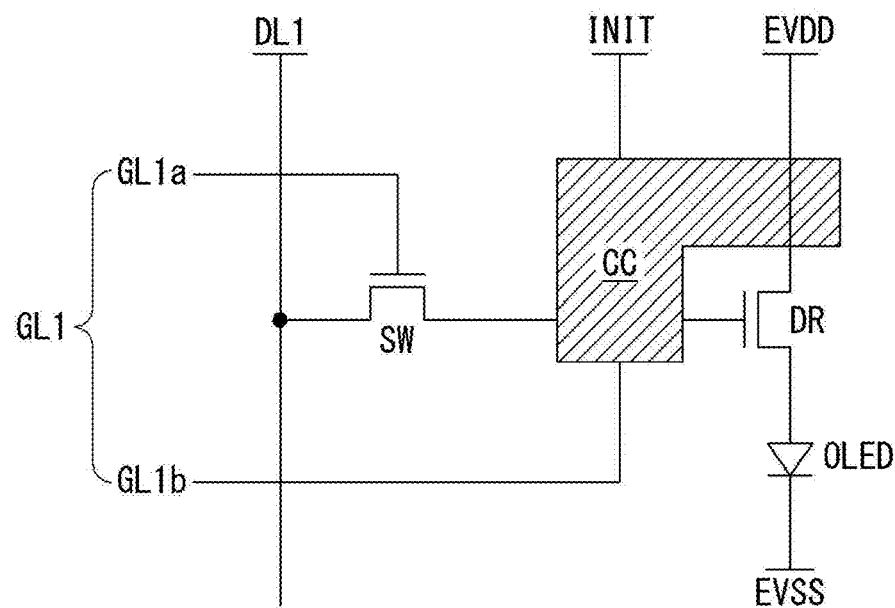
FIGS. 3A and 3B are circuit diagrams showing part of FIG. 2 in detail.
Figure 3B:
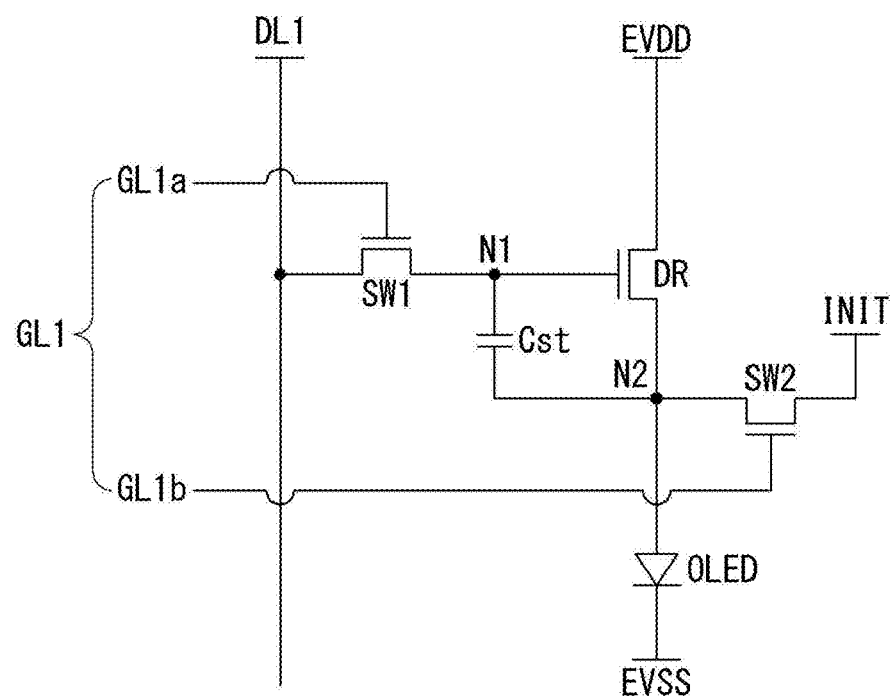

FIG. 1 is a block diagram of an organic light-emitting display device. FIG. 2 is a circuit diagram of a subpixel. FIGS. 3A and 3B are circuit diagrams showing part of FIG. 2 in detail.

With reference to the example of FIG. 1, the organic light-emitting display device may include a timing controller 151, a data driver 155, a scan driver 157, a display panel 110, and a power supply 153. The timing controller 151 may receive driving signals, including a data enable signal, a vertical synchronization signal, a horizontal synchronization signal, and a clock signal, along with a data signal DATA from an image processor (not shown). The timing controller 151 may output a gate timing control signal GDC for controlling operation timing of the scan driver 157 and a data timing control signal DDC for controlling operation timing of the data driver 155 based on the driving signals. The timing controller 151 may be configured in the form of an integrated circuit (IC).

The data driver 155 may sample and latch the data signal DATA supplied from the timing controller 151 in response to the data timing control signal DDC supplied from the timing controller 151 to convert the digital data signal into an analog data signal (or data voltage) using a gamma reference voltage and may output the analog data signal. The data driver 155 may output the data signal DATA through data lines DL1 to DLn. The data driver 155 may be configured in the form of an IC.

The scan driver 157 may output a scan signal in response to the gate timing control signal GDC supplied from the timing controller 151. The scan driver 157 may output the scan signal through scan lines GL1 to GLm. The scan driver 157 may be configured in the form of an IC or according to gate in panel (a method of forming a transistor through a thin film forming process) in the display panel 110.

The power supply 153 may output a high voltage and a low voltage. The high voltage and the low voltage output from the power supply 153 may be supplied to the display panel 110. The high voltage may be supplied to the display panel 110 through a first power line EVDD and the low voltage may be supplied to the display panel through a second power line EVSS. The power supply 153 may be configured in the form of an IC.

The display panel 110 may display an image based on the data signal DATA supplied from the data driver 155, the scan signal supplied from the scan driver 157, and power supplied from the power supply 153. The display panel 110 may include subpixels SP, which may operate to display images and emit light.

The display panel 110 may be divided into a bottom-emission type that may emit light downward from a transistor array, a top-emission type that may emit light upward from the transistor array, and a dual-emission type that may emit light upward and downward.

The subpixels SP may include red, green, and blue subpixels or white, red, green, and blue pixels, although embodiments are not limited thereto. The subpixels SP may have one or more emission areas according to emission characteristics.

With reference to the example of FIG. 2, a single subpixel may include a programming unit SC for setting a gate-source voltage of a driving transistor DR and an organic LED (OLED), which may be positioned at an intersection of a data line DL1 and a scan line GL1. The OLED may include an anode ANO, a cathode CAT, and an organic emission layer between the anode ANO and the cathode CAT. The anode ANO may be connected to the driving transistor DR.

The programming unit SC may be realized by a transistor array including at least one switching transistor and at least one capacitor. The transistor array may be realized, for example, based on a CMOS semiconductor, a PMOS transistor, or an NMOS transistor. Transistors included in the transistor array may be p-type or n-type transistors. Further, semiconductor layers of the transistors included in the transistor array of the subpixel may include amorphous silicon, polysilicon, and/or oxide.

The switching transistor may be turned on in response to a scan signal from the scan line GL1 to apply a data voltage from the data line DL1 to one electrode of the capacitor. The driving transistor DL may adjust the emission quantity of the OLED by controlling the quantity of current according to the voltage charged in the capacitor. The emission quantity of the OLED may be proportional to the quantity of current supplied from the driving transistor DR. Further, the subpixel may be connected to the first power line EVDD and the second power line EVSS, and may be provided with the high voltage and the low voltage therethrough.

With reference to the example of FIG. 3A, the subpixel may include a compensation circuit CC, in addition to the aforementioned switching transistor SW, the driving transistor DR, the capacitor, and the OLED. The compensation circuit CC may include one or more transistors connected to a compensation signal line INIT. The compensation circuit CC may set a gate-to-source voltage of the driving transistor DR to a voltage in which the threshold voltage of the driving transistor DR has been reflected to reduce or prevent luminance variation due to the threshold voltage of the driving transistor DR when the OLED emits light. For example, the scan line GL1 may include at least two scan lines GL1a and GL1b for controlling the switching transistor SW and transistors of the compensation circuit CC.

With reference to the example of FIG. 3B, the subpixel may include a switching transistor SW1, a driving transistor DR, a sensing transistor SW2, a capacitor Cst, and an OLED. The sensing transistor SW2 may be included in the compensation circuit CC, and may perform a sensing operation for compensation operation of the subpixel.

The switching transistor SW1 may provide a data voltage supplied through the data line DL1 to a first node N1 in response to a scan signal supplied through the first scan line GL1a. In addition, the sensing transistor SW2 may initialize or sense a second node N2 between the driving transistor DR and the OLED in response to a sensing signal supplied through the second sensing line GL1b.

The subpixel circuit configurations illustrated in FIGS. 3A and 3B are merely for aiding in understanding the present disclosure. That is, the subpixel circuit of embodiments of the present disclosure is not limited thereto, and may be configured in various configurations, such as 2T1C (2-transistor, 1-capacitor), 3T1C, 4T2C, 6T2C, and 7T2C.

Figure 4A:
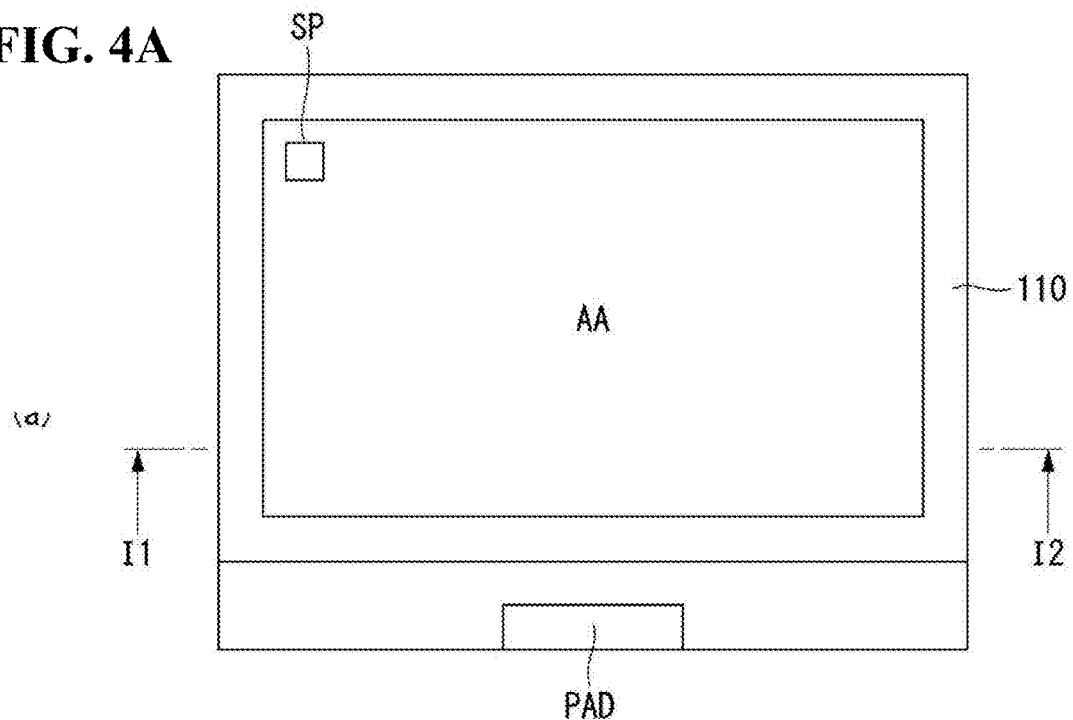
FIGS. 4A and 4B illustrates a cross section of a display panel.
Figure 4B:
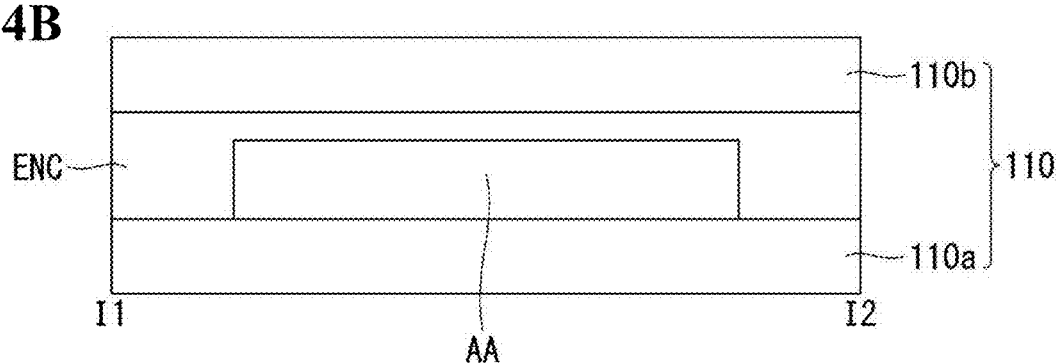
Figure 5:
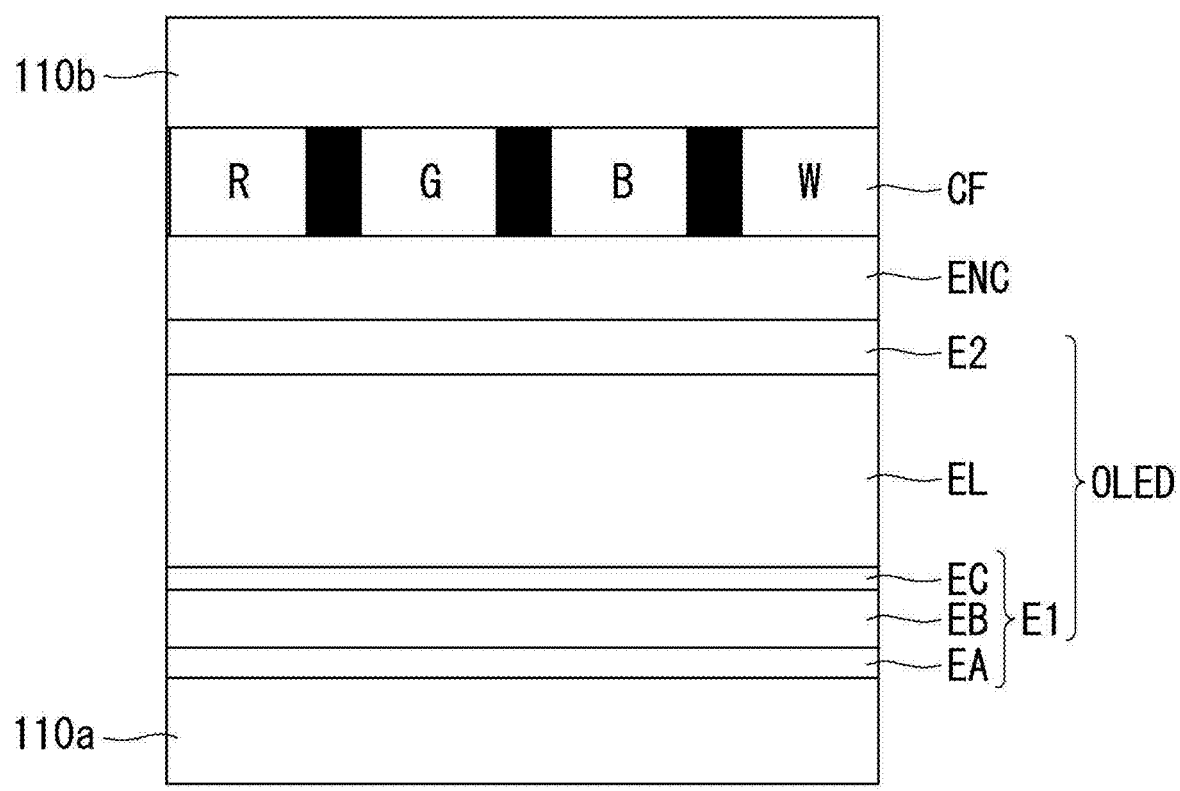
FIG. 5 is a cross-sectional view for describing a structure of subpixels.
Figure 6:
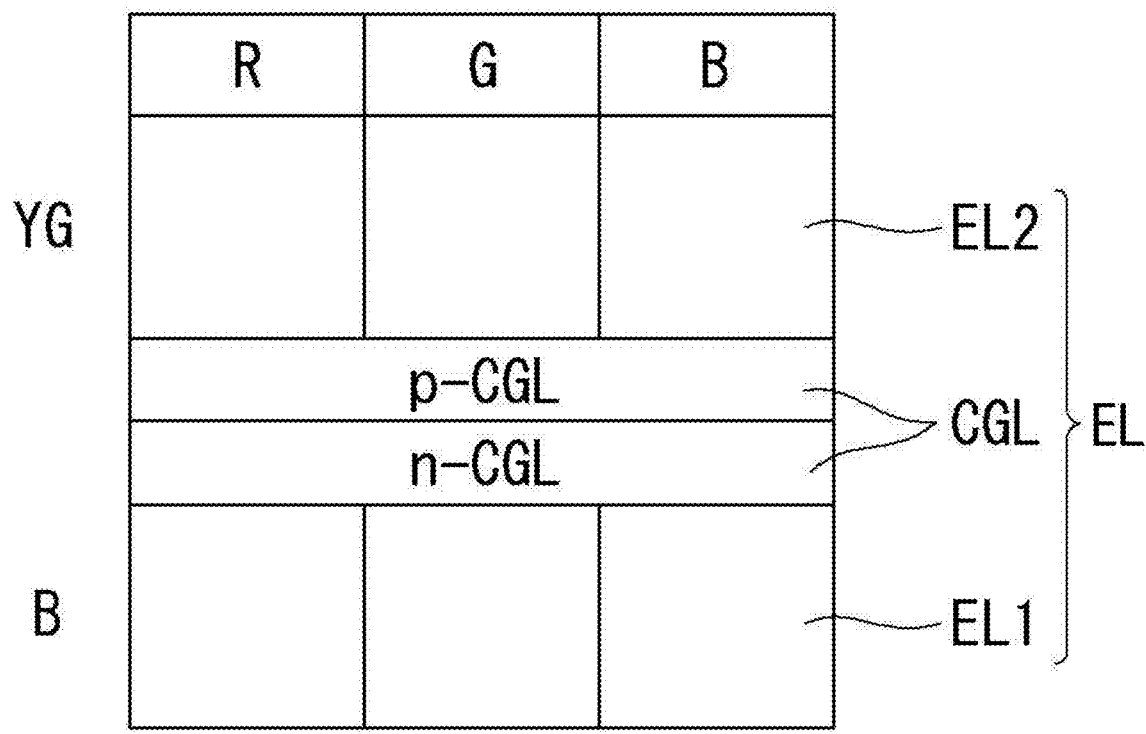
FIG. 6 is a diagram for describing emission characteristics of subpixels.

FIGS. 4A and 4B illustrates a cross section of a display panel. FIG. 5 is a cross-sectional view for describing a structure of subpixels. FIG. 6 is a diagram for describing emission characteristics of subpixels.

With reference to the examples of FIGS. 4A and 4B, the display panel 110 may include a first substrate 110a, a second substrate 110b, a display area AA, a pad part PAD, and a protection film layer ENC. The first substrate 110a and the second substrate 110b may include a transparent resin or glass through which light can pass, although embodiments are not limited thereto. The display area AA may include subpixels for emitting light. The pad part PAD may include pads for electrical connection with an external substrate.

The display area AA may occupy almost the entire surface of the first substrate 110a, and the pad part PAD may be outside one side of the first substrate 110a. The display area AA may be protected from moisture or oxygen by being encapsulated by the protection film layer ENC between the first substrate 110a and the second substrate 110b. Alternatively, the pad part PAD may be exposed to the outside. However, embodiments of the display panel 110 are not limited to the aforementioned structure, and may be realized in various structures.

With reference to the example of FIG. 5, the subpixels may include an OLED and a color filter layer CF. The OLED may be formed on one side of the substrate 110a, and may include an anode E1 (which may be a cathode), an emission layer EL for emitting light, such as white light, and a cathode E2 (which may be an anode). Light emitted from the OLED may be changed to a different color by the color filter layer CF. Accordingly, light emitted from the OLED may not necessarily be white light. However, an example in which the OLED may emit white light is described below.

The color filter layer CF may change white light emitted from the emission layer EL into red (R), green (G), and blue (B) light, and may project white light W without change. A region in which red light may be emitted through the color filter layer CF may be defined as a "red subpixel," a region in which green light may be emitted through the color filter layer CF may be defined as a "green subpixel," a region in which blue light may be emitted through the color filter layer CF may be defined as a "blue subpixel," and a region in which white light may be emitted through the color filter layer CF may be defined as a "white subpixel."

The color filter layer CF may be on the side of the second substrate 110b that faces the OLED or on the OLED. The protection film layer ENC may be between the cathode E2 and the color filter layer CF. However, the protection film layer ENC may be omitted according to a desired encapsulation structure.

The anode E1 may include a multilayer structure, including a first electrode layer EA, a second electrode layer EB, and a third electrode layer EC, e.g., to improve characteristics of emission to the second substrate 110b. The first electrode layer EA may include a transparent oxide material (e.g., indium tin oxide (ITO)), the second electrode layer EB may include a metal material (e.g., silver (Ag)) having reflectivity, and the third electrode layer EC may include a transparent oxide material (e.g., ITO). However, the anode E1 is not limited to this structure.

With reference to the example of FIG. 6, the emission layer EL may include a first emission layer EL1, a charge generation layer CGL, and a second emission layer EL2. The emission layer EL, including the charge generation layer CGL, may further may include two or more emission layers, in addition to the two emission layers EL1 and EL2. Accordingly, the emission layer EL, including the charge generation layer CGL, may be regarded as an emission layer including at least two emission layers.

The emission layer EL may emit white light based on light emitted from the first emission layer EL1 and the second emission layer EL2. For example, the first emission layer EL1 may include a material capable of emitting blue light B, and the second emission layer EL2 may include a material capable of emitting yellowish-green (YG) (or yellow) light.

The charge generation layer CGL may include a PN junction of an N-type charge generation layer n-CGL and a P-type charge generation layer p-CGL, or may include an NP junction of a P-type charge generation layer p-CGL and an N-type charge generation layer n-CGL. The charge generation layer CGL may generate charges, or may separate holes from electrons and inject charges to the first emission layer (first stack) EL1 and the second emission layer (second stack) EL2. The N-type charge generation layer n-CGL may provide electrons to the first emission layer EL1, and the P-type charge generation layer p-CGL may provide holes to the second emission layer EL2, e.g., to reduce a driving voltage while improving emission efficiency of the element including multiple emission layers.

First Embodiment

Figure 7:
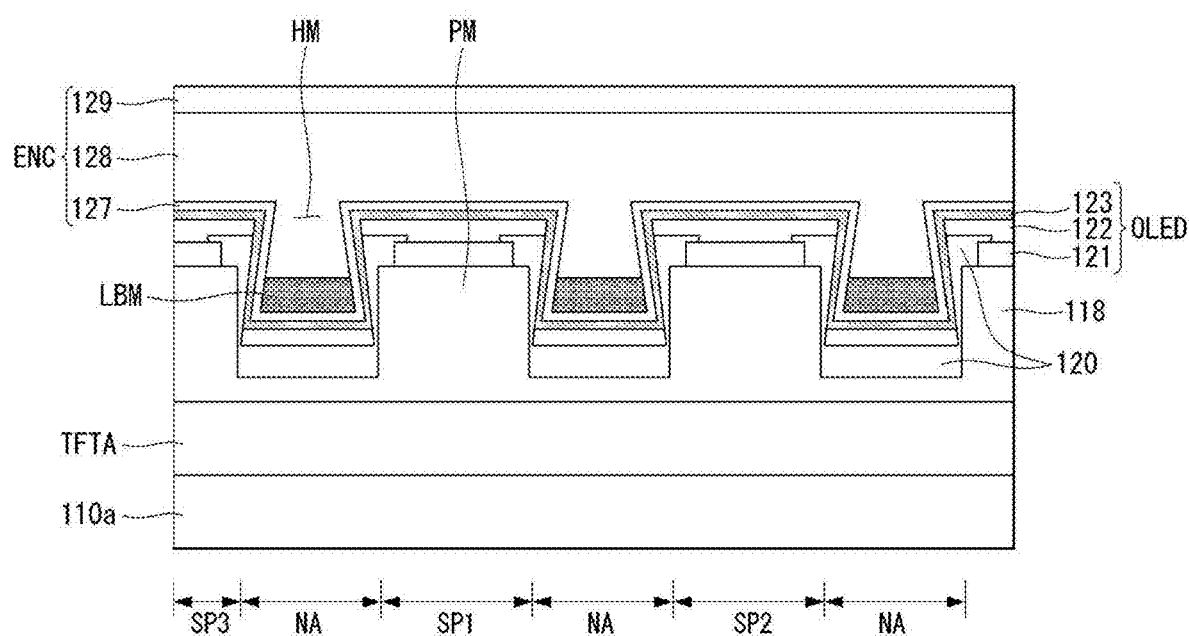
FIG. 7 is a first cross-sectional view of a display panel according to a first embodiment of the present disclosure.
Figure 8:
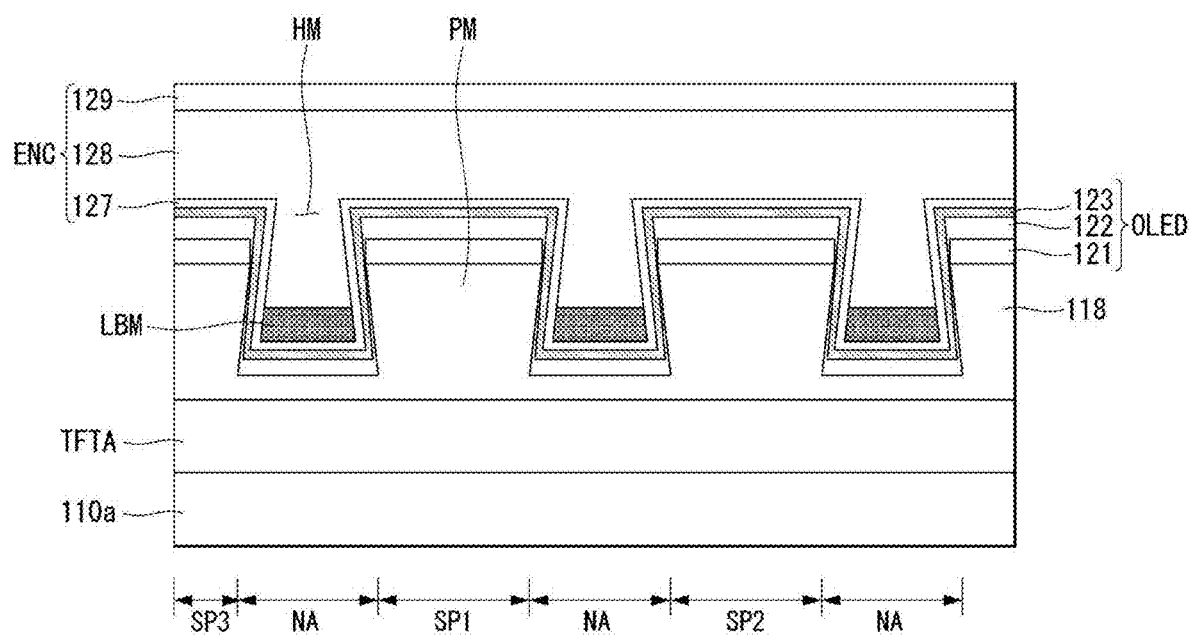
FIG. 8 is a second cross-sectional view of the display panel according to the first embodiment of the present disclosure.
Figure 9:
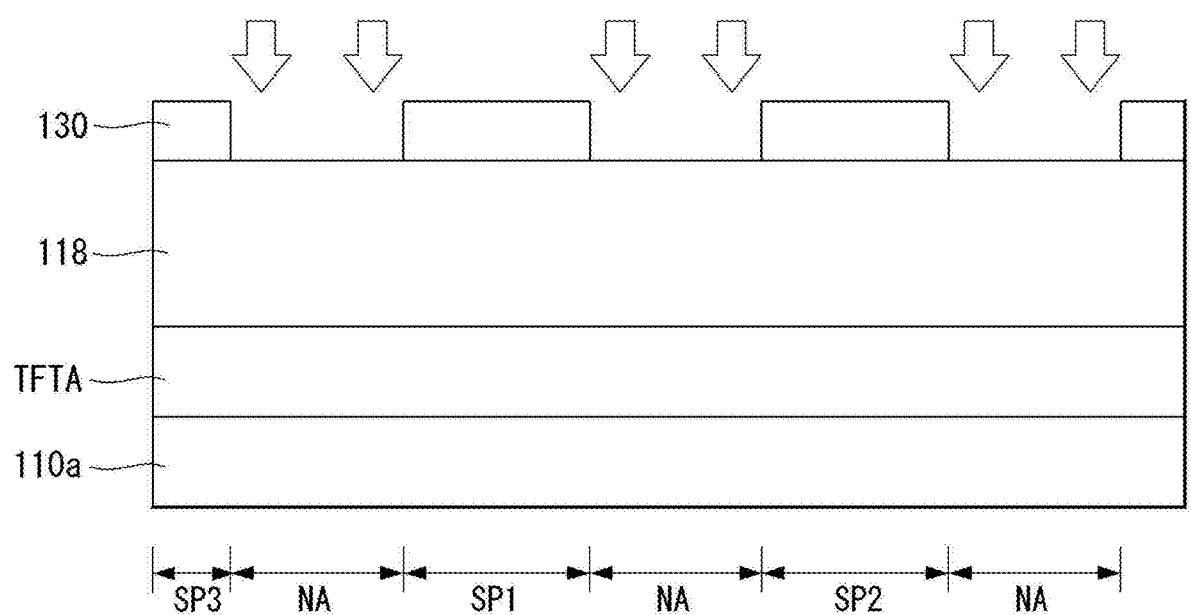
FIGS. 9 to 12 are cross-sectional views for describing a method of manufacturing the display panel according to the first embodiment of the present disclosure.
Figure 10:
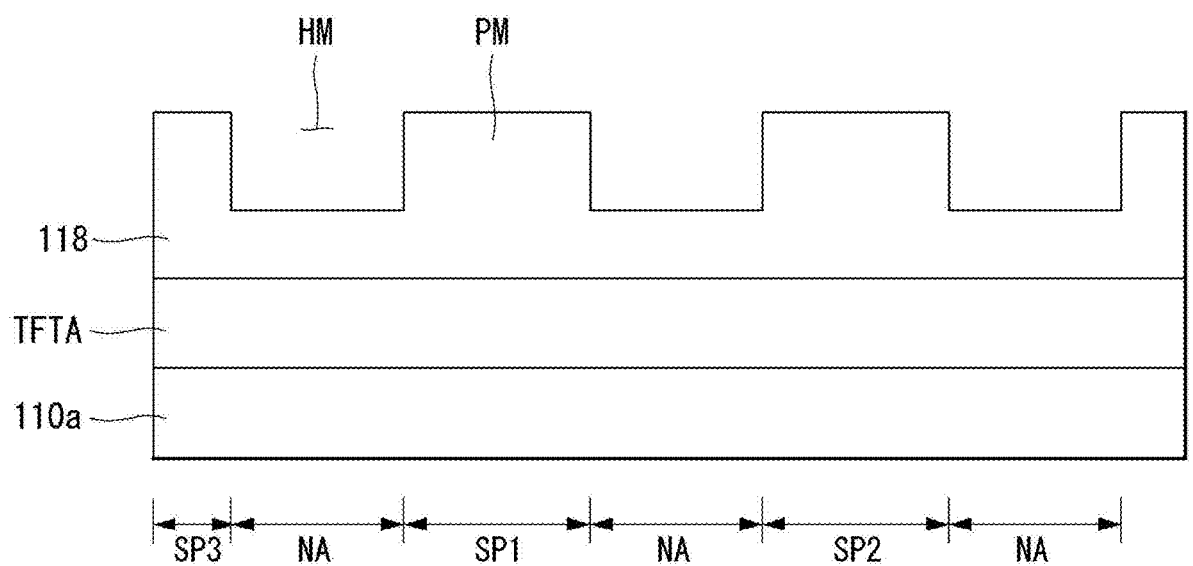

FIG. 7 is a first cross-sectional view of a display panel according to a first embodiment of the present disclosure. FIG. 8 is a second cross-sectional view of the display panel according to the first embodiment of the present disclosure.

With reference to the examples of FIGS. 7 and 8, the display panel according to the first embodiment may include a first substrate 110a, a transistor array TFTA, OLEDs, a black matrix layer LBM, and a protection film layer ENC. The display panel may include a plurality of subpixels, such as first to third subpixels SP1 to SP3. The first to third subpixels SP1 to SP3 may be defined based on the transistor array TFTA and the OLEDs, and will be described below.

The transistor TFTA may be on the first substrate 110a. The transistor array TFTA may include switching transistors, driving transistors, capacitors, and power lines that may be arranged corresponding to the first to third subpixels SP1 to SP3.

The transistor array TFTA may have various configurations, as described above with reference to the examples of FIGS. 3A and 3B, and may have various lamination structures according to the position of a gate electrode, such as top-gate and bottom-gate structures, and thus is not described in detail. Components included in the transistor array TFTA, such as switching transistors, driving transistors, and capacitors, may be protected by an insulating layer or a protection layer.

An insulating layer 118 may be on the transistor array TFTA. The insulating layer 118 may be on the protection layer, which may be the highest layer of the transistor array TFTA. The insulating layer 118 may include a material capable of planarizing the surface while forming depressions HM and protrusions PM protruding from depressions HM. Although the depressions HM and the protrusions PM are illustrated in the examples of FIGS. 7 and 8 as having a rectangular shape, embodiments are not limited thereto. The depressions HM and the protrusions PM may be only in the display area on the first substrate 110a, or may be extended to part of a non-display area.

The protrusions PM may respectively define the regions of the first to third subpixels SP1 to SP3. The protrusions PM of the insulating layer 118 may provide regions in which OLEDs may be formed, and may define the positions of emission regions or openings in which light may be emitted. The depressions HM of the insulating layer 118 may provide regions in which the black matrix layer LBM may be formed, and may define non-emission areas NA in which light may be not emitted.

Each OLED may include a pixel electrode layer 121, an emission layer 122, and a common electrode layer 123 positioned in a protrusion PM of the insulating layer 118. The pixel electrode layer 121 may be selected as an anode (or a cathode), and the common electrode layer 123 may be selected as a cathode (or an anode). The pixel electrode layer 121 may be connected to the source electrode or the drain electrode of a driving transistor included in the transistor array TFTA. The pixel electrode layer 121 may be isolated to correspond to the protrusion PM. The pixel electrode layer 121 may be formed in a monolayer structure or a multilayer structure including a reflective electrode layer.

A bank layer 120 may be on the pixel electrode layer 121. The bank layer 120 may be over the protrusions PM and the depressions HM. The bank layer 120 on the protrusions PM may have openings that selectively expose the pixel electrode layers 121. The openings of the bank layer 120 may be openings or emission regions of the subpixels. The bank layer 120 on the depressions HM may cover the surface of the insulating layer 118 in the depressions HM, without having openings. The bank layer 120 may cover the edge of the pixel electrode layer 121 and the sidewalls of the protrusions PM. The thickness of the bank layer 120 on the sidewalls of the protrusions PM may decrease with decreasing distance to the bottom of the protrusions PM, e.g., taper. When the bank layer 120 on the sidewalls of the protrusions PM has this form, the sidewalls of the protrusions PM have a reverse-tapered shape.

The emission layer 122 may be on the exposure pixel electrode layer 121 and the depressions HM. The emission layer 122 may include one emission layer or at least two emission layers. The emission layer 122 may emit red, green, blue, or white light. However, embodiments are not limited thereto. The emission layer 122 on the pixel electrode layer 121 may be electrically isolated from the emission layer 122 on the depressions HM.

The emission layer 122 on the pixel electrode layer 121 may be isolated from the emission layer 122 on the depressions HM according to the structure and height of the protrusions PM and the depressions HM of the insulating layer 118. Further, the emission layer 122 on the pixel electrode layer 121 may be isolated from the emission layer 122 on the depressions HM according to the reverse-tapered structure of the bank layer 120. That is, the emission layer 122 on the pixel electrode layer 121 may be isolated from the emission layer 122 on the depressions HM according to one or both of the depressions and the protrusions of the insulating layer 118 and the reverse-tapered structure of the bank layer 120. As a result, the emission layer 122 on the pixel electrode layer 121 can emit light, whereas the emission layer 122 on the depressions HM cannot emit light. In addition, the emission layer 122 on the pixel electrode layer 121 may be isolated from the emission layer 122 on the depressions HM by controlling the height or tapered structure of the bank layer 120.

An example in which the bank layer 120 is present has been described. However, the bank layer 120 may be omitted, as shown in the example of FIG. 8. When the bank layer 120 is omitted, the pixel electrode layer 121 of each OLED may be respectively formed to correspond to the area of each protrusion PM. For example, the emission region of a subpixel may be widened as compared to a case in which the bank layer 120 is present. When the bank layer 120 is omitted, the insulating layer 118 may serve as the bank layer 120. As such, the protrusions PM of the insulating layer 118 may be formed in a reverse-tapered shape. That is, the lower parts of the protrusions PM may have a narrow width, whereas the upper parts thereof may have a wide width (e.g., the depression may be opposite to the protrusion). According to this structure, the emission layer 122 on the pixel electrode layer 121 may be isolated from the emission layer 122 on the depressions HM by the reverse-tapered protrusions PM.

The common electrode layer 123 may cover the emission layer 122 and the depressions HM. The common electrode layer 123 may cover the emission layers 122 of all subpixels formed on the first substrate 110a. The common electrode layer 123 may be formed in a monolayer structure or a multilayer structure including a low-resistance layer. The common electrode layer 123 may be formed along the topography of the protrusions PM and the depressions HM, and thus may be formed on the emission layer 122, the sidewalls of the protrusions PM, and the surface of the depressions HM, without being cut. Although it may be desirable that the common electrode layer 123 be formed in the display area without being cut to reduce the resistance of the display panel, the common electrode layer 123 may include a cut region, e.g., due to the structure of the depressions HM.

As described above, when the OLEDs are formed on the protrusions PM of the insulating layer 118, the emission layer 122 may be isolated per subpixel. Thus, current leakage generated between neighboring subpixels may be reduced or prevented.

The protection film layer ENC may be on the common electrode layer 123. Although the protection film layer ENC may be formed in either a monolayer or multilayer structure according to an embodiment, an example in which the protection film layer ENC is formed in a multilayer structure is described below for convenience of explanation. The protection film layer ENC may include first to third protection film layers 127, 128, and 129. The first protection film layer 127 may cover the overall surface of the common electrode layer 123. The first protection film layer 127 may be formed along the surface of the common electrode layer 123, and thus may have a topography corresponding to the depressions HM and the protrusions PM of the insulating layer 118. The second protection film layer 128 may cover the overall surface of the first protection film layer 127. The second protection film layer 128 may be thicker than the first and third protection film layers 127 and 129. The third protection film layer 129 may cover the overall surface of the second protection film layer 128. The first to third protection film layers 127 to 129 may have a structure in which an inorganic material and an organic material may be alternately laminated. For example, one or more of: indium (In), silicon (Si), zinc (Zn), tungsten (W), molybdenum (Mo), and/or aluminum (Al) may be selected as the inorganic material. A monomer or a polymer may be selected as the organic material. However, embodiments are not limited to these examples.

The black matrix layer LBM may be in the depressions HM of the insulating layer 118. The black matrix layer LBM may include a material capable of blocking or absorbing light, such as a black matrix. The black matrix layer LBM may be on the first protection film layer 127 of the protection film layer ENC, for example, because the first protection film layer 127 may primarily serve to protect the OLEDs positioned thereunder from moisture, oxygen, and the like. That is, the black matrix layer LBM may be formed on the first protection film layer 127 in the depressions HM in consideration of the external air infiltration prevention capability of the first protection film layer 127. However, if the black matrix layer LBM is not conductive, or is capable of absorbing moisture and oxygen, the black matrix layer LBM may be formed on the common electrode layer 123.

In addition, the black matrix layer LBM may reduce or prevent a waveguide phenomenon in which light moves to neighboring subpixels due to a refractive index difference between internal layers when the protection film layer ENC is used, and may reduce or prevent color mixing due to the waveguide phenomenon when the black matrix layer LBM is positioned between layers of the protection film layers ENC and has a height similar to that of the protrusions PM or the common electrode layer 123, and thus may block a light path that may cause the waveguide phenomenon, or may absorb light.

FIGS. 9 to 12 are cross-sectional views for describing a method of manufacturing the display panel according to the first embodiment of the present disclosure.

The method of manufacturing the display panel will be briefly described based on the structure illustrated in the example of FIG. 7. With reference to the examples of FIGS. 9 and 10, subpixel regions, in which the first to third subpixels SP1 to SP3 may be formed, and non-emission areas NA may be defined on the first substrate 110a. The transistor array TFTA may be formed on the first substrate 110a. The insulating layer 118 may be formed on the transistor array TFTA. The insulating layer 118 may be formed of an organic material, such as a negative overcoat, polyimide, a benzocyclobutene series resin, acrylate, or photoacrylate, but embodiments are not limited thereto.

A sacrificial layer 130 may be formed on the insulating layer 118. The sacrificial layer 130 may be formed to correspond to the subpixel regions of the first to third subpixels SP1 to SP3. The sacrificial layer 130 may cover the subpixels regions, and may expose the non-emission areas NA. The insulating layer 118 may be etched using the sacrificial layer 130. Although dry etching may be used as an etching method, embodiments are not limited thereto. When the insulating layer 118 is etched using the sacrificial layer 130, protrusions PM and depressions HM may be formed in the insulating layer 118.

Figure 11:
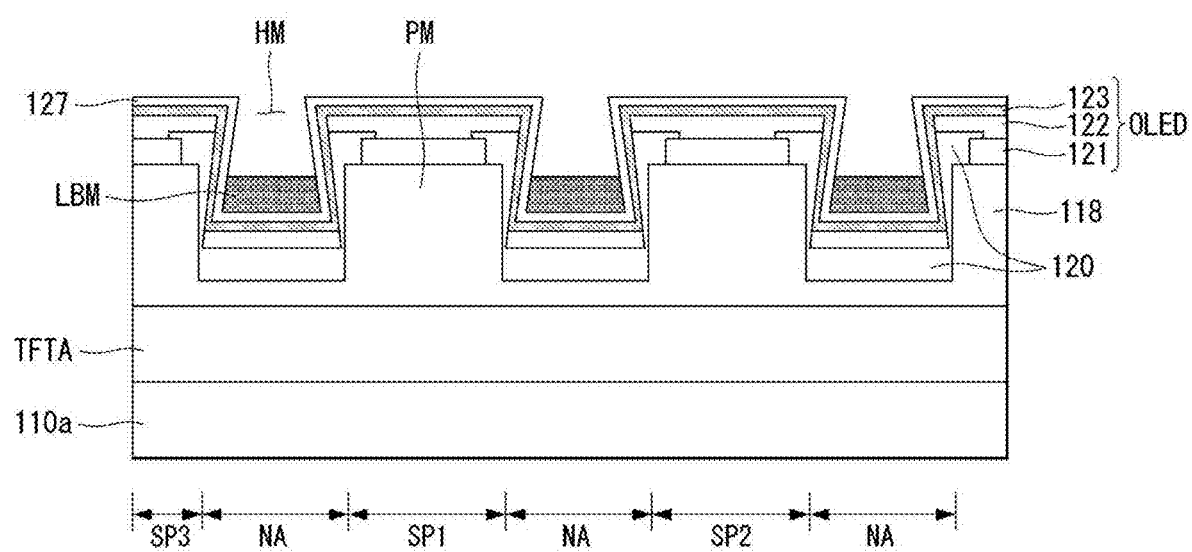
Figure 12:
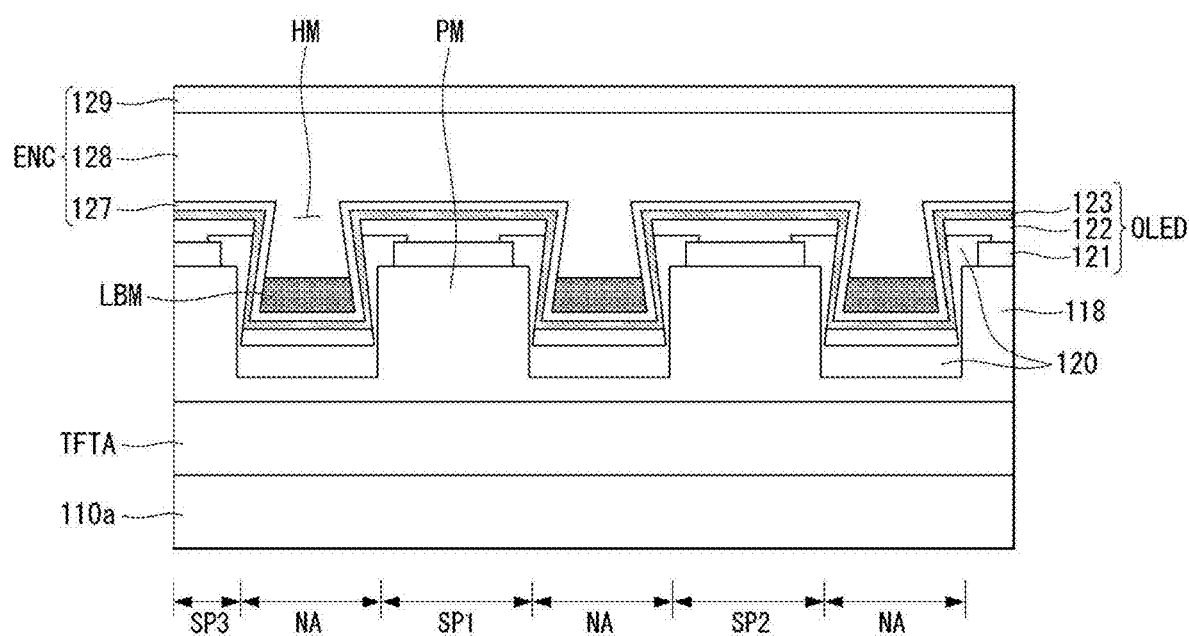

With reference to the examples of FIGS. 11 and 12, the pixel electrode layer 121 may be formed on the protrusions PM of the insulating layer 118. The bank layer 120 may be formed to cover the pixel electrode layer 121, the sidewalls of the protrusions PM and the surface of the depressions HM. The sidewalls of the protrusions PM may have a reverse-tapered shape according to the bank layer 120. Accordingly, the upper parts of the depressions HM may be relatively narrow, and the lower parts thereof may be relatively wide. The bank layer 120 may be etched to selectively expose the pixel electrode layer 121. The emission layer 122 may be formed on the pixel electrode layer 121 and the depressions HM. The common electrode layer 123 may be formed to cover the emission layer 122 and the depressions HM.

The first protection film layer 127 may be formed to cover the common electrode layer 123. The black matrix layer LBM may be formed on the first protection film layer 127 positioned in the depressions HM. The second protection film layer 128 may be formed on the first protection film layer 127 and the black matrix layer LBM. The third protection film layer 129 may be formed on the second protection film layer 128.

Hereinafter, other examples based on the first embodiment of the present disclosure will be described. The following description is based on differences from the examples of FIGS. 7 and 8, and duplicate description is not repeated.

Figure 13:
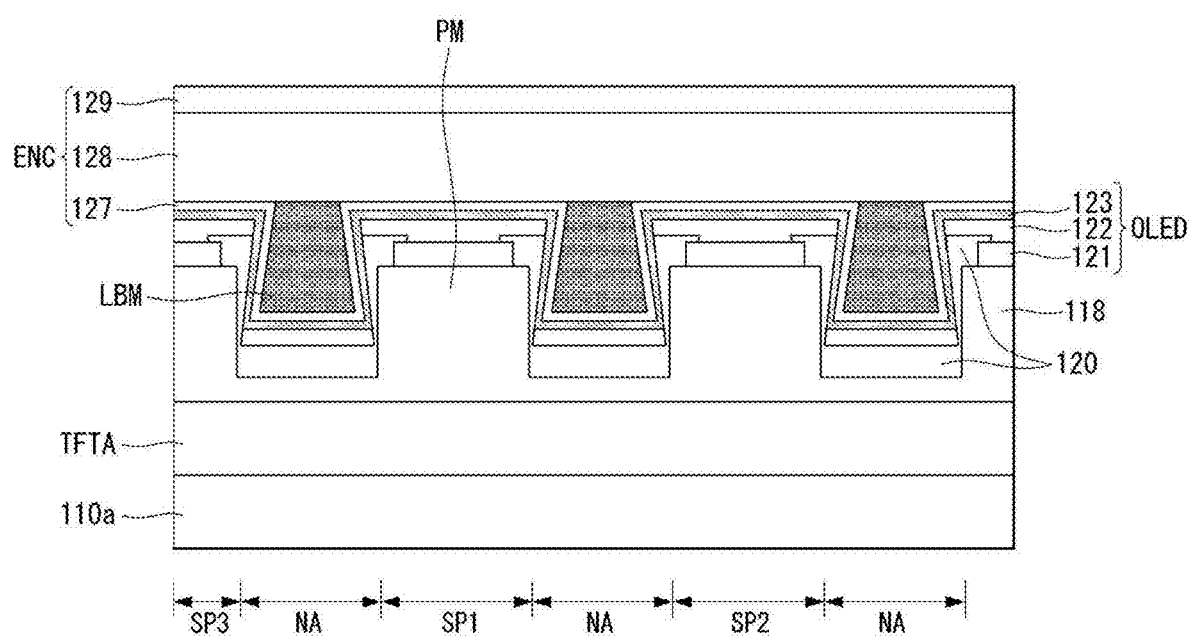
FIG. 13 is a third cross-sectional view of the display panel according to the first embodiment of the present disclosure.
Figure 14:
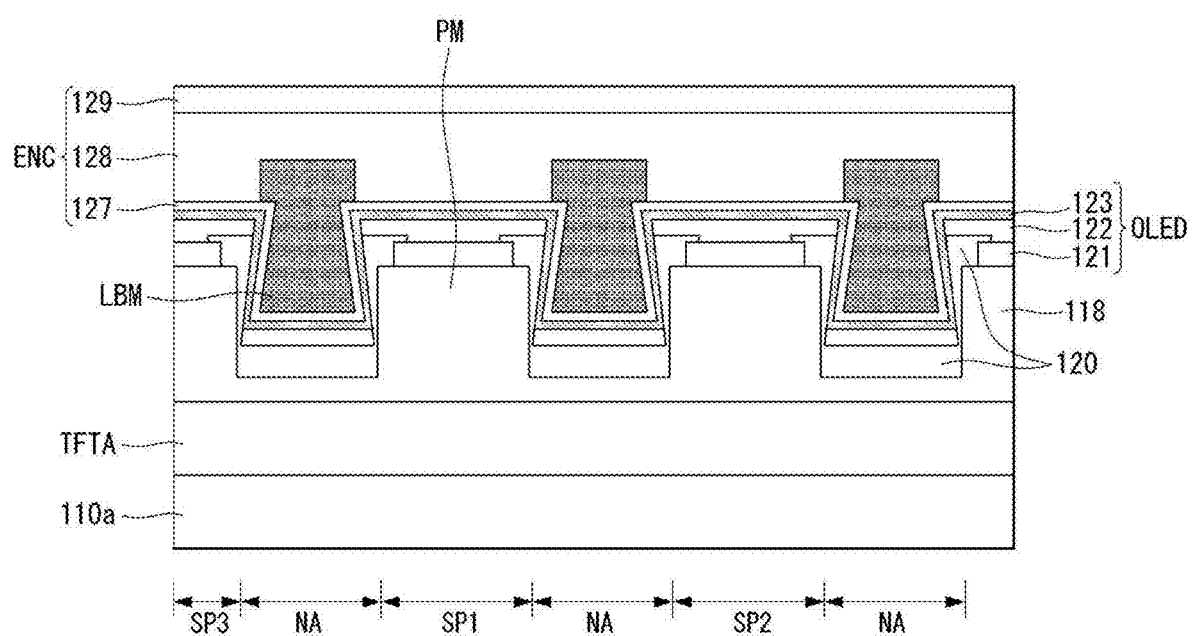
FIG. 14 is a fourth cross-sectional view of the display panel according to the first embodiment of the present disclosure.
Figure 15:
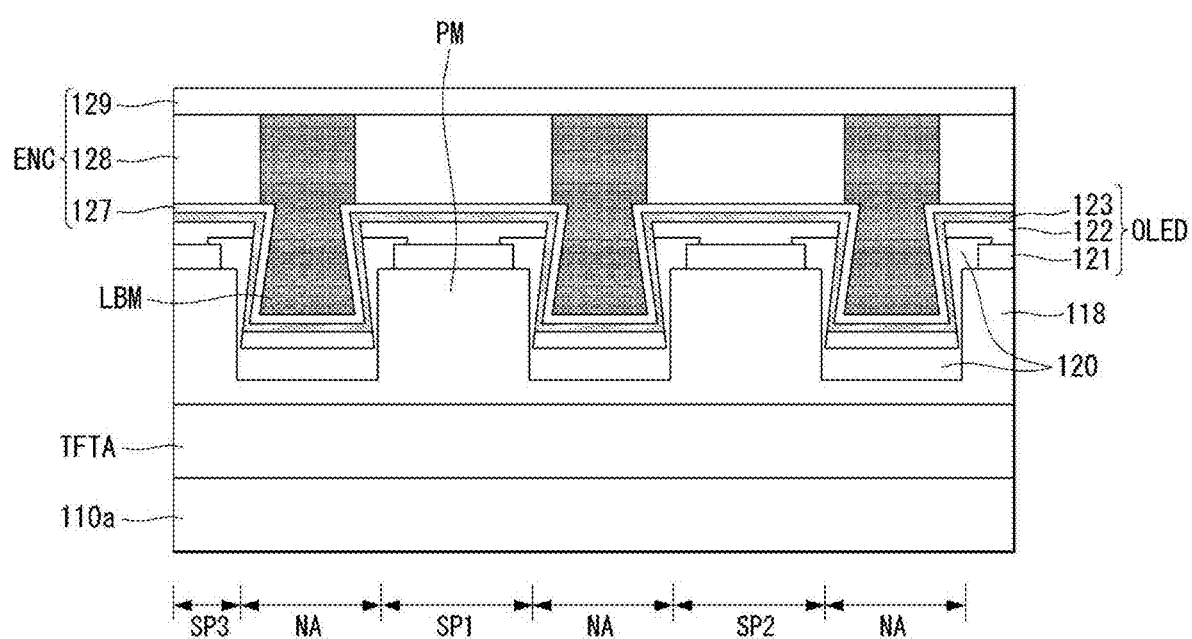
FIG. 15 is a fifth cross-sectional view of the display panel according to the first embodiment of the present disclosure.

FIG. 13 is a third cross-sectional view of the display panel according to the first embodiment of the present disclosure. FIG. 14 is a fourth cross-sectional view of the display panel according to the first embodiment of the present disclosure. FIG. 15 is a fifth cross-sectional view of the display panel according to the first embodiment of the present disclosure.

With reference to the example of FIG. 13, the black matrix layer LBM may completely fill the depressions HM, e.g., may have a thickness corresponding to the surface of the first protection film layer 127 on the protrusions PM. Further, the black matrix layer LBM may have a thickness corresponding to the surface of the common electrode layer 123 of the OLED (not shown). The FIG. 13 example shows a structure in which the black matrix layer LBM is higher than the emission layer 122 to further improve the capability of blocking light paths or absorbing light as compared to the structures shown in the examples of FIGS. 7 and 8.

With reference to the example of FIG. 14, the black matrix layer LBM may completely fill the depressions HM, and may protrude from the surface of the first protection film layer 127 on the protrusions PM. The FIG. 14 example shows a structure in which the black matrix layer LBM is formed to be higher than the first protection film layer 127 to further improve the capability of blocking light paths or absorbing moving light as compared to the structure shown in the example of FIG. 13.

With reference to the example of FIG. 15, the black matrix layer LBM may completely fill the depressions HM, and may protrude from the surface of the first protection film layer 127 on the protrusions PM, while having a height corresponding to the surface of the second protection film layer 128. The FIG. 15 example shows a structure in which the black matrix layer LBM is formed to have a height corresponding to the surface of the second protection film layer 128 to further improve the capability of blocking light paths or absorbing light as compared to the structure shown in the example of FIG. 14.

As can be seen from the examples of FIGS. 13 to 15, the design of the black matrix layer LBM may be changed in consideration of the waveguide phenomenon and color mixing caused thereby.

Second Embodiment

Figure 16:
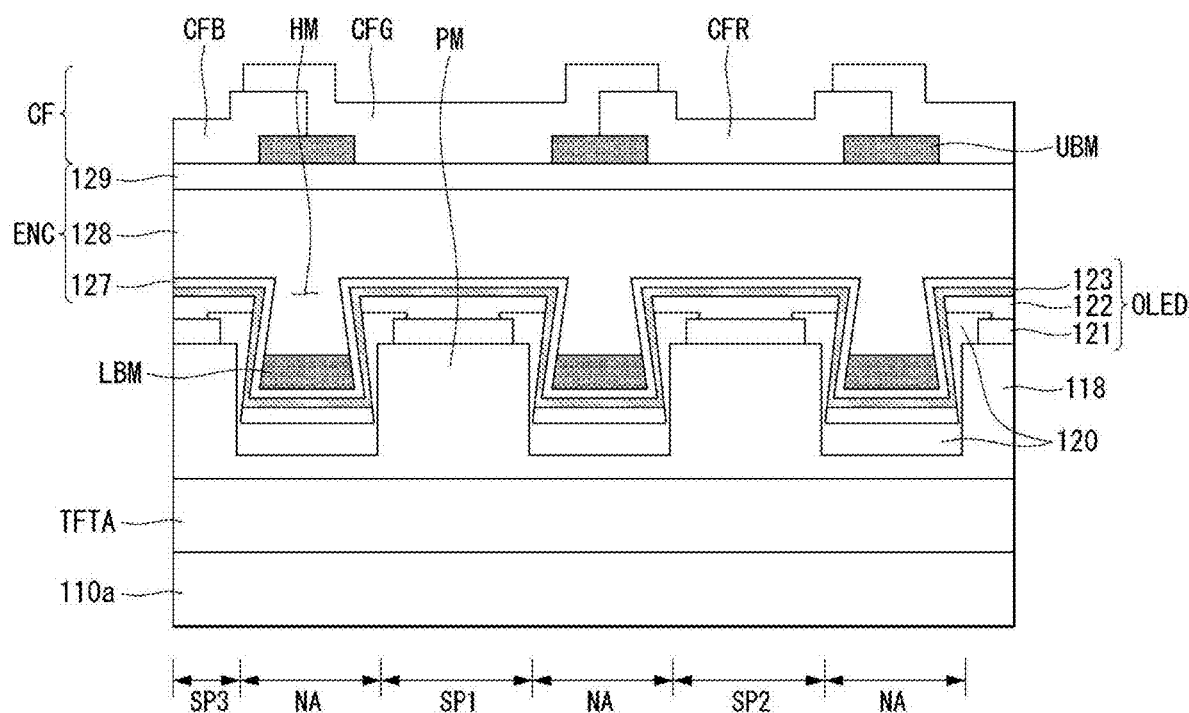
FIG. 16 is a first cross-sectional view of a display panel according to a second embodiment of the present disclosure.
Figure 17:
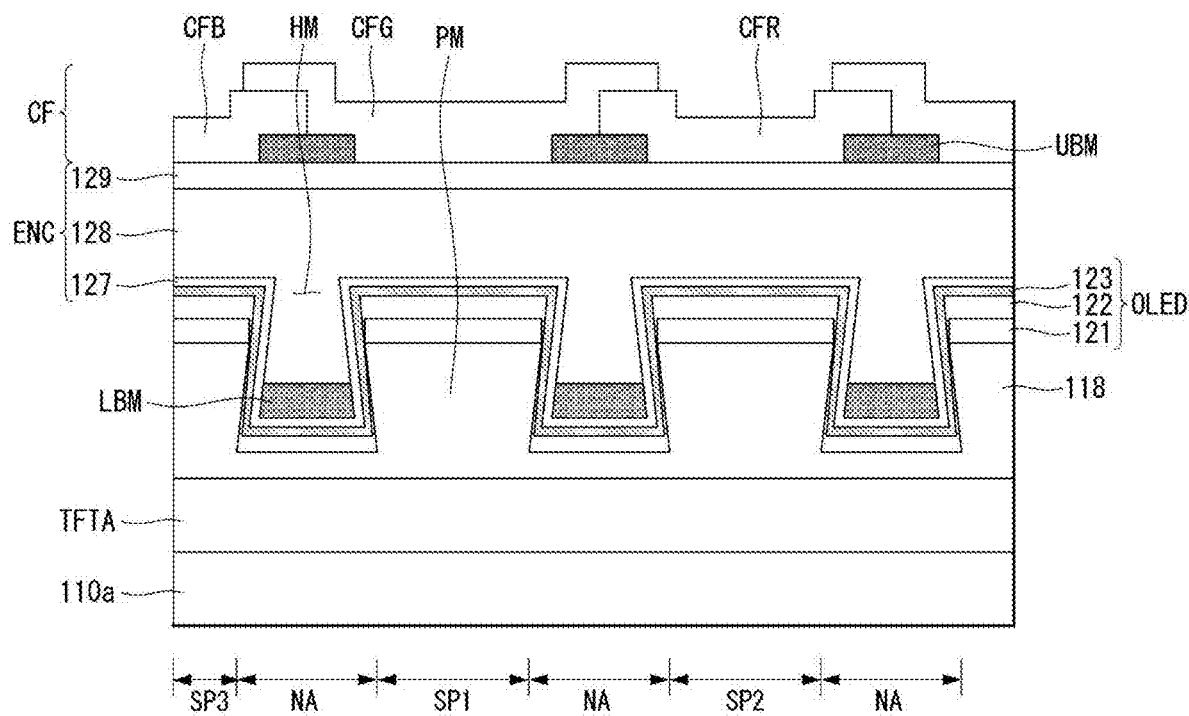
FIG. 17 is a second cross-sectional view of the display panel according to the second embodiment of the present disclosure.
Figure 18:
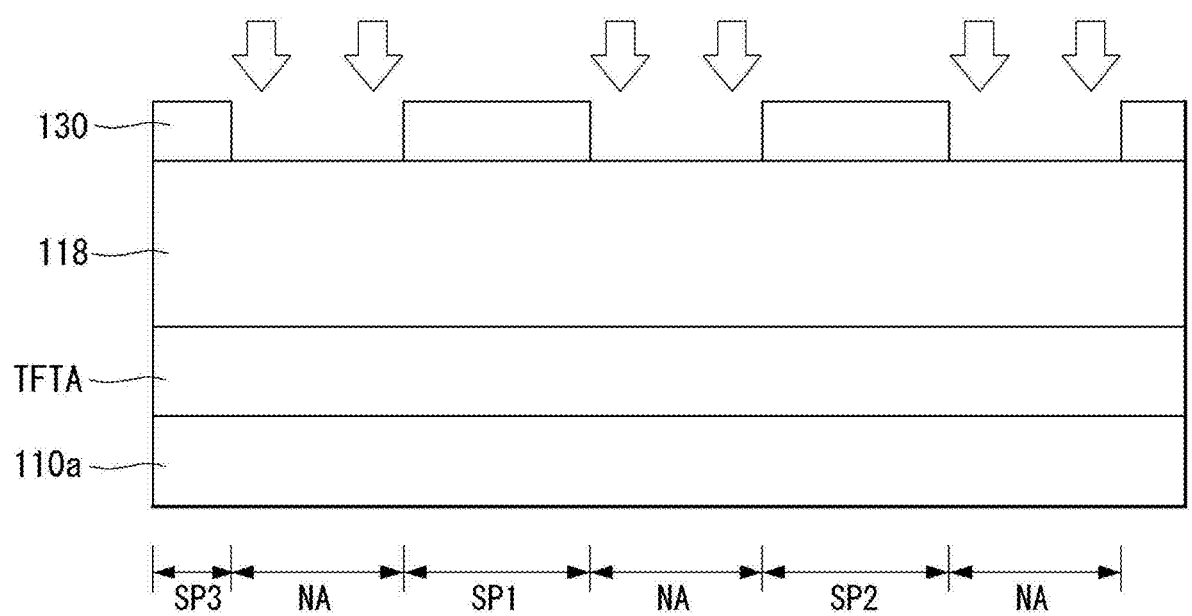
FIGS. 18 to 21 are cross-sectional views for describing a method of manufacturing the display panel according to the second embodiment of the present disclosure.
Figure 19:
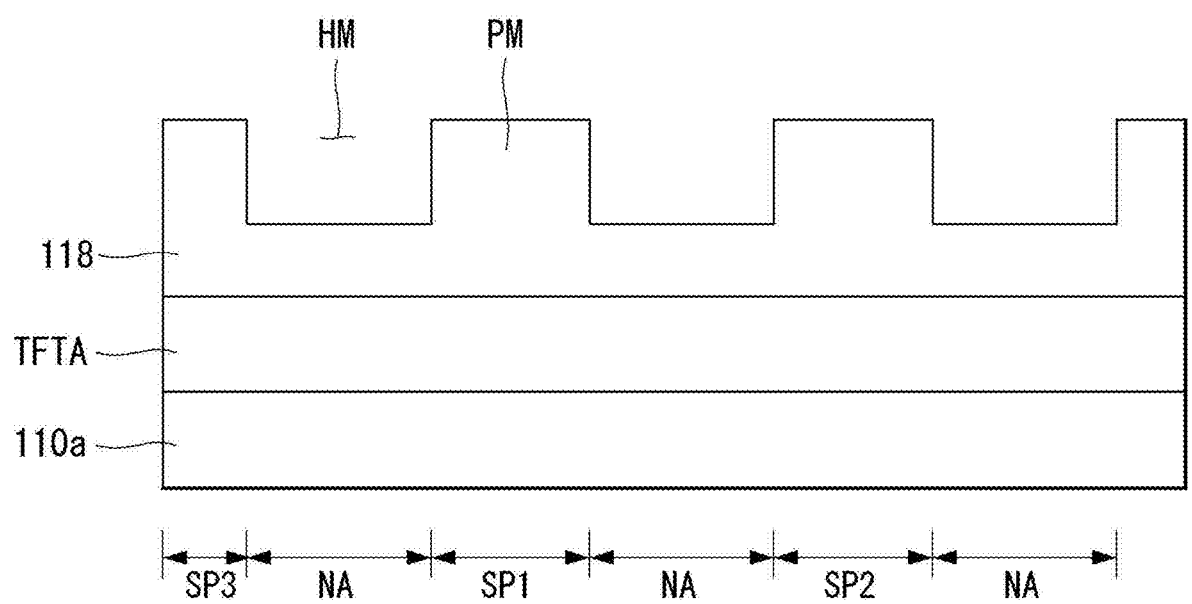

FIG. 16 is a first cross-sectional view of a display panel according to a second embodiment of the present disclosure. FIG. 17 is a second cross-sectional view of the display panel according to the second embodiment of the present disclosure.

With reference to the examples of FIGS. 16 and 17, the display panel according to the second embodiment may include a first substrate 110a, a transistor array TFTA, OLEDs, a protection film layer ENC, and a color filter layer CF. The display panel may include a plurality of subpixels, such as first to third subpixels SP1 to SP3. The first to third subpixels SP1 to SP3 may be defined based on the transistor array TFTA and the OLEDs, and will be described below.

The transistor TFTA may be on the first substrate 110a. The transistor array TFTA may include switching transistors, driving transistors, capacitors, and power lines arranged corresponding to the first to third subpixels SP1 to SP3.

The transistor array TFTA may have various configurations, as described above with reference to the examples of FIGS. 3A and 3B, and may have various lamination structures according to the position of a gate electrode, such as top-gate and bottom-gate structures, and thus is not described in detail. Components included in the transistor array TFTA, such as switching transistors, driving transistors, and capacitors, may be protected by an insulating layer or a protection layer.

An insulating layer 118 may be on the transistor array TFTA. The insulating layer 118 may be on the protection layer, which may be the highest layer of the transistor array TFTA. The insulating layer 118 may include a material capable of planarizing the surface, while forming depressions HM and protrusions PM protruding from depressions HM. Although the depressions HM and the protrusions PM have a rectangular shape in the examples of FIGS. 16 and 17, embodiments are not limited thereto. The depressions HM and the protrusions PM may be only in the display area on the first substrate 110a, or may extend to part of a non-display area.

The protrusions PM may respectively define the regions of the first to third subpixels SP1 to SP3. The protrusions PM of the insulating layer 118 may provide regions in which OLEDs may be formed, and may define the positions of emission regions or openings in which light may be emitted. The depressions HM of the insulating layer 118 may provide regions in which the black matrix layer LBM may be formed, and may define non-emission areas NA in which light may be not emitted.

Each OLED may include a pixel electrode layer 121, an emission layer 122, and a common electrode layer 123 in a protrusion PM of the insulating layer 118. The pixel electrode layer 121 may be selected as an anode (or a cathode), and the common electrode layer 123 may be selected as a cathode (or an anode). The pixel electrode layer 121 may be connected to the source electrode or the drain electrode of a driving transistor included in the transistor array TFTA. The pixel electrode layer 121 may be isolated to correspond to the protrusion PM. The pixel electrode layer 121 may be formed in a monolayer structure or a multilayer structure including a reflective electrode layer.

A bank layer 120 may be on the pixel electrode layer 121. The bank layer 120 may be over the protrusions PM and the depressions HM. The bank layer 120 on the protrusions PM may have openings that selectively expose the pixel electrode layers 121. The openings of the bank layer 120 may serve as openings or emission regions of the subpixels. The bank layer 120 on the depressions HM may cover the surface of the insulating layer 118 in the depressions HM, without having openings. The bank layer 120 may cover the edge of the pixel electrode layer 121 and the sidewalls of the protrusions PM. The thickness of the bank layer 120 on the sidewalls of the protrusions PM may decrease with decreasing distance to the bottom of the protrusions PM. When the bank layer 120 formed on the sidewalls of the protrusions PM has this form, the sidewalls of the protrusions PM have a reverse-tapered shape.

The emission layer 122 may be on the exposure pixel electrode layer 121 and the depressions HM. The emission layer 122 may include one emission layer or at least two emission layers. The emission layer 122 may emit red, green, blue, or white light. However, embodiments are not limited thereto. The emission layer 122 on the pixel electrode layer 121 may be electrically isolated from the emission layer 122 on the depressions HM.

The emission layer 122 on the pixel electrode layer 121 may be isolated from the emission layer 122 on the depressions HM according to the structure and height of the protrusions PM and the depressions HM of the insulating layer 118. Further, the emission layer 122 on the pixel electrode layer 121 may be isolated from the emission layer 122 on the depressions HM according to the reverse-tapered structure of the bank layer 120. That is, the emission layer 122 on the pixel electrode layer 121 may be isolated from the emission layer 122 on the depressions HM according to one or both of the depressions and the protrusions of the insulating layer 118 and the reverse-tapered structure of the bank layer 120. As a result, the emission layer 122 on the pixel electrode layer 121 can emit light, whereas the emission layer 122 on the depressions HM cannot emit light. In addition, the emission layer 122 on the pixel electrode layer 121 may be isolated from the emission layer 122 on the depressions HM by controlling the height or tapered structure of the bank layer 120.

An example in which the bank layer 120 is present has been described. However, the bank layer 120 may be omitted, as shown in the example of FIG. 17. When the bank layer 120 is omitted, the pixel electrode layer 121 of each OLED may be formed to correspond to the area of each protrusion PM. For example, the emission region of a subpixel may be widened as compared to a case in which the bank layer 120 may be present. When the bank layer 120 is omitted, the insulating layer 118 may serve as the bank layer 120. As such, the protrusions PM of the insulating layer 118 may have a reverse-tapered shape. That is, the lower parts of the protrusions PM may have a narrow width, whereas the upper parts thereof may have a wide width (e.g., the depression may be opposite to the protrusion). According to this structure, the emission layer 122 on the pixel electrode layer 121 may be isolated from the emission layer 122 on the depressions HM by the reverse-tapered protrusions PM.

The common electrode layer 123 may cover the emission layer 122 and the depressions HM. The common electrode layer 123 may cover the emission layers 122 of all subpixels formed on the first substrate 110a. The common electrode layer 123 may be formed in a monolayer structure or a multilayer structure including a low-resistance layer. The common electrode layer 123 may be formed along the topography of the protrusions PM and the depressions HM, and thus may be formed on the emission layer 122, the sidewalls of the protrusions PM, and the surface of the depressions HM, without being cut. Although it may be desirable that the common electrode layer 123 be formed in the display area without being cut to reduce the resistance of the display panel, the common electrode layer 123 may include a cut region, e.g., due to the structure of the depressions HM.

As described above, when the OLEDs are formed on the protrusions PM of the insulating layer 118, the emission layer 122 may be isolated per subpixel. Thus, current leakage generated between neighboring subpixels may be reduced or prevented.

The protection film layer ENC may be on the common electrode layer 123. Although the protection film layer ENC may be formed in a monolayer or multilayer structure according to embodiments, an example in which the protection film layer ENC is formed in a multilayer structure is described below for convenience of explanation. The protection film layer ENC may include first to third protection film layers 127, 128, and 129. The first protection film layer 127 may cover the overall surface of the common electrode layer 123. The first protection film layer 127 may be formed along the surface of the common electrode layer 123, and thus may have a topography corresponding to the depressions HM and the protrusions PM of the insulating layer 118. The second protection film layer 128 may cover the overall surface of the first protection film layer 127. The second protection film layer 128 may be thicker than the first and third protection film layers 127 and 129. The third protection film layer 129 may cover the overall surface of the second protection film layer 128. The first to third protection film layers 127 to 129 may have a structure in which an inorganic material and an organic material may be alternately laminated. For example, one or more of: In, Si, Zn, W, Mo, and/or Al may be selected as the inorganic material. A monomer or a polymer may be selected as the organic material. However, embodiments are not limited thereto.

A first black matrix layer LBM may be positioned in the depressions HM of the insulating layer 118. The first black matrix layer LBM may include a material capable of blocking or absorbing light, such as a black matrix. The first black matrix layer LBM may be positioned on the first protection film layer 127 of the protection film layer ENC because the first protection film layer 127 may primarily serve to protect the OLEDs positioned thereunder from moisture, oxygen, and the like. That is, the first black matrix layer LBM may be on the first protection film layer 127 in the depressions HM in consideration of the external air infiltration prevention capability of the first protection film layer 127. However, if the first black matrix layer LBM is not conductive or is capable of absorbing moisture and oxygen, the first black matrix layer LBM may be on the common electrode layer 123.

In addition, the first black matrix layer LBM may reduce or prevent a waveguide phenomenon in which light moves to neighboring subpixels due to a refractive index difference between internal layers when the protection film layer ENC may be used, and may reduce or prevent color mixing due to the waveguide phenomenon when the first black matrix layer LBM is positioned between layers of the protection film layers ENC and has a height similar to that of the protrusions PM or the common electrode layer 123, and thus may block a light path that may cause the waveguide phenomenon, or may absorb light.

A second black matrix layer UBM may be on the protection film layer ENC. The second black matrix layer UBM may be at a position corresponding to the first black matrix layer LBM. That is, the second black matrix layer UBM may be in the non-emission areas NA on the first black matrix layer LBM. The second black matrix layer UBM may include a material capable of blocking or absorbing light, such as a black material.

A color filter layer CF may be on the protection film layer ENC. The color filter layer CF may cover the second black matrix layer UBM, or may be between the second block matrix layer patterns. The color filter layer CF may include a red color filter layer CFR, a green color filter layer CFG, and a blue color filter layer CFB. The red color filter layer CFR, the green color filter layer CFG, and the blue color filter layer CFB may be arranged corresponding to the positions of the first to third subpixels SP1 to SP3. When the color filter layer CF is formed, all the emission layers 122 included in the first to third subpixels SP1 to SP3 may emit white light or light of the same color as the color filter layer CF. For example, the emission layer 122 included in the first subpixel SP1 may emit red light, the emission layer 122 included in the second subpixel SP2 may emit green light, and the emission layer 122 included in the third subpixel SP1 may emit blue light.

FIGS. 18 to 21 are cross-sectional views for describing a method of manufacturing the display panel according to the second embodiment of the present disclosure.

The method of manufacturing the display panel will be briefly described based on the structure illustrated in the example of FIG. 16. With reference to the examples of FIGS. 18 and 19, subpixel regions in which the first to third subpixels SP1 to SP3 may be formed and non-emission areas NA may be defined on the first substrate 110*a*. The transistor array TFTA may be formed on the first substrate 110*a*. The insulating layer 118 may be formed on the transistor array TFTA. The insulating layer 118 may be formed of an organic material, such as a negative overcoat, polyimide, a benzocyclobutene series resin, acrylate, and/or photoacrylate, but embodiments are not limited thereto.

A sacrificial layer 130 may be formed on the insulating layer 118. The sacrificial layer 130 may be formed to correspond to the subpixel regions of the first to third subpixels SP1 to SP3. The sacrificial layer 130 may cover the subpixels regions, and may expose the non-emission areas NA. The insulating layer 118 may be etched using the sacrificial layer 130. Although dry etching may be used as an etching method, embodiments are not limited thereto. When the insulating layer 118 is etched using the sacrificial layer 130, protrusions PM and depressions HM may be formed in the insulating layer 118.

Figure 20:
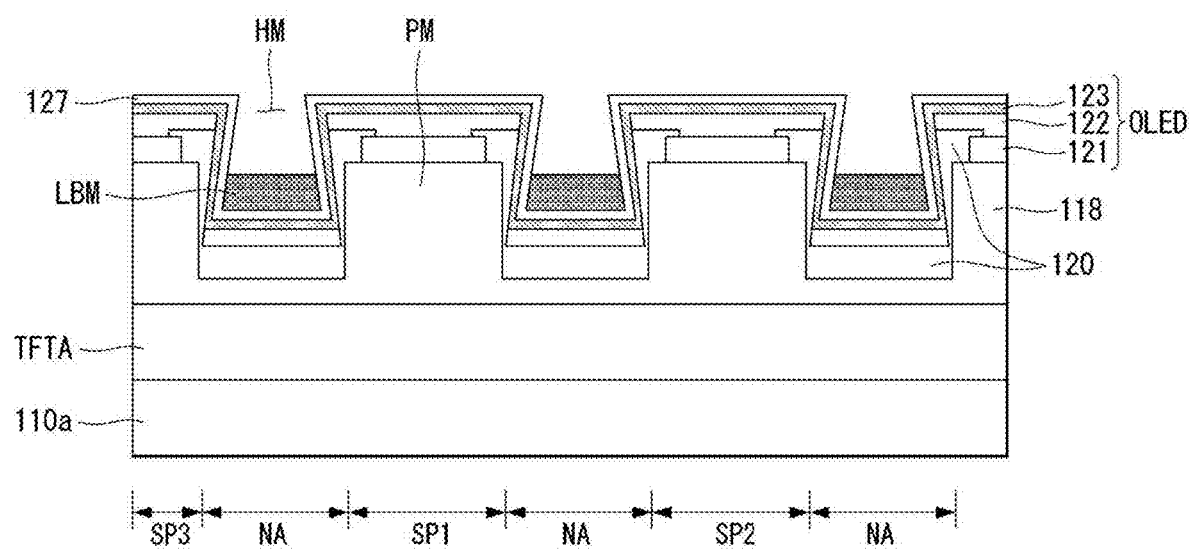
Figure 21:
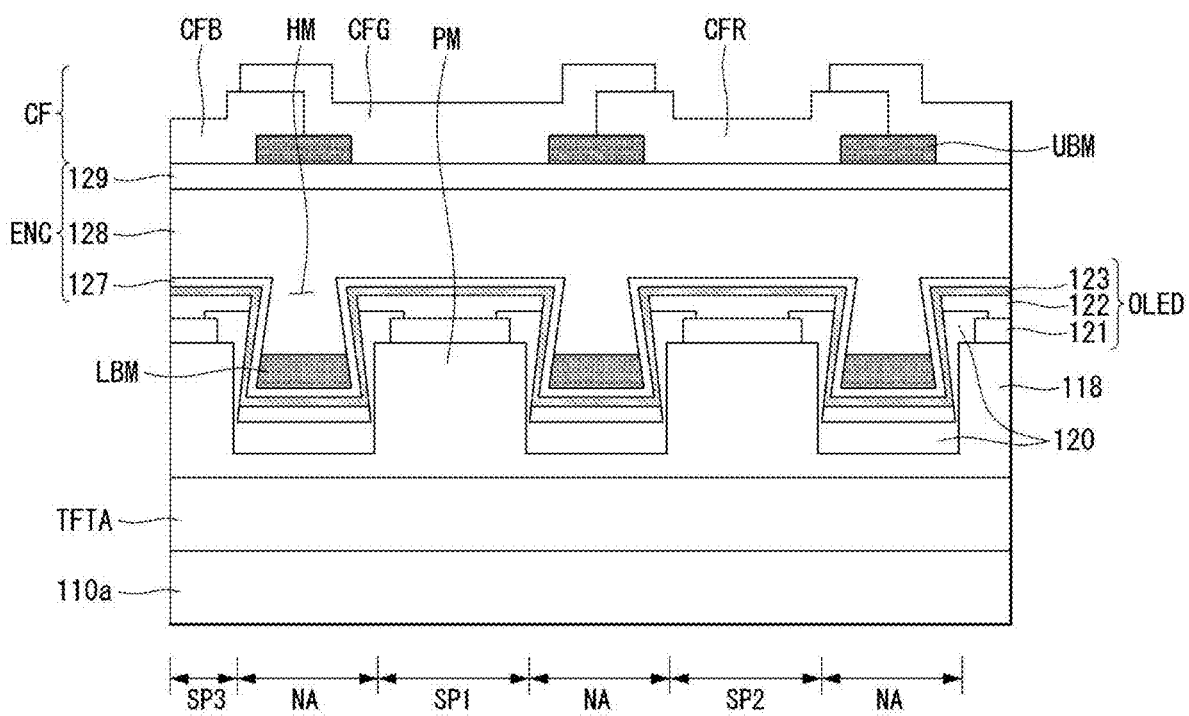

With reference to the examples of FIGS. 20 and 21, the pixel electrode layer 121 may be formed on the protrusions PM of the insulating layer 118. The bank layer 120 may be formed to cover the pixel electrode layer 121, the sidewalls of the protrusions PM, and the surface of the depressions HM. The sidewalls of the protrusions PM have a reverse-tapered shape according to the bank layer 120. Accordingly, the upper parts of the depressions HM may be relatively narrow, and the lower parts thereof may be relatively wide. The bank layer 120 may be etched to selectively expose the pixel electrode layer 121. The emission layer 122 may be formed on the pixel electrode layer 121 and the depressions HM. The common electrode layer 123 may be formed to cover the emission layer 122 and the depressions HM.

The first protection film layer 127 may be formed to cover the common electrode layer 123. The first black matrix layer LBM may be formed on the first protection film layer 127 in the depressions HM. The second protection film layer 128 may be formed on the first protection film layer 127 and the first black matrix layer LBM. The third protection film layer 129 may be formed on the second protection film layer 128. The second black matrix layer UBM may be formed on the third protection film layer 129. The color filter layer CF may be formed on the third protection film layer 129.

Hereinafter, other examples based on the second embodiment of the present disclosure will be described. The following description is based on differences from the examples of FIGS. 16 and 17.

Figure 22:
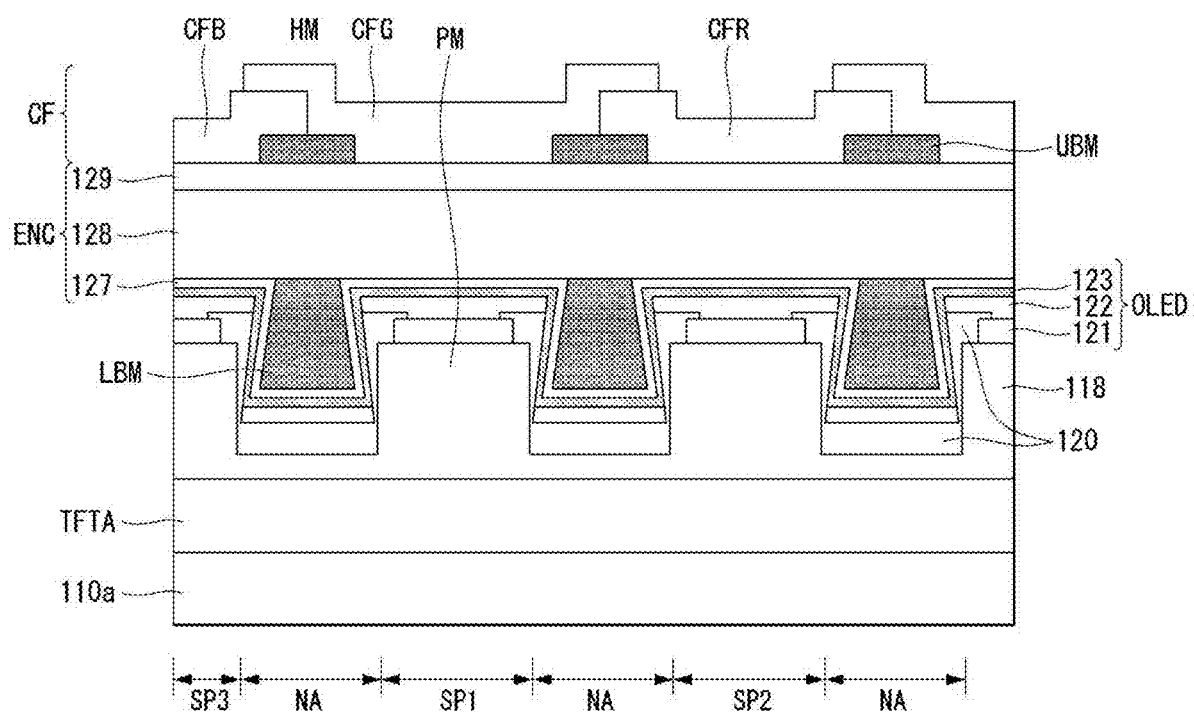
FIG. 22 is a third cross-sectional view of the display panel according to the second embodiment of the present disclosure.
Figure 23:
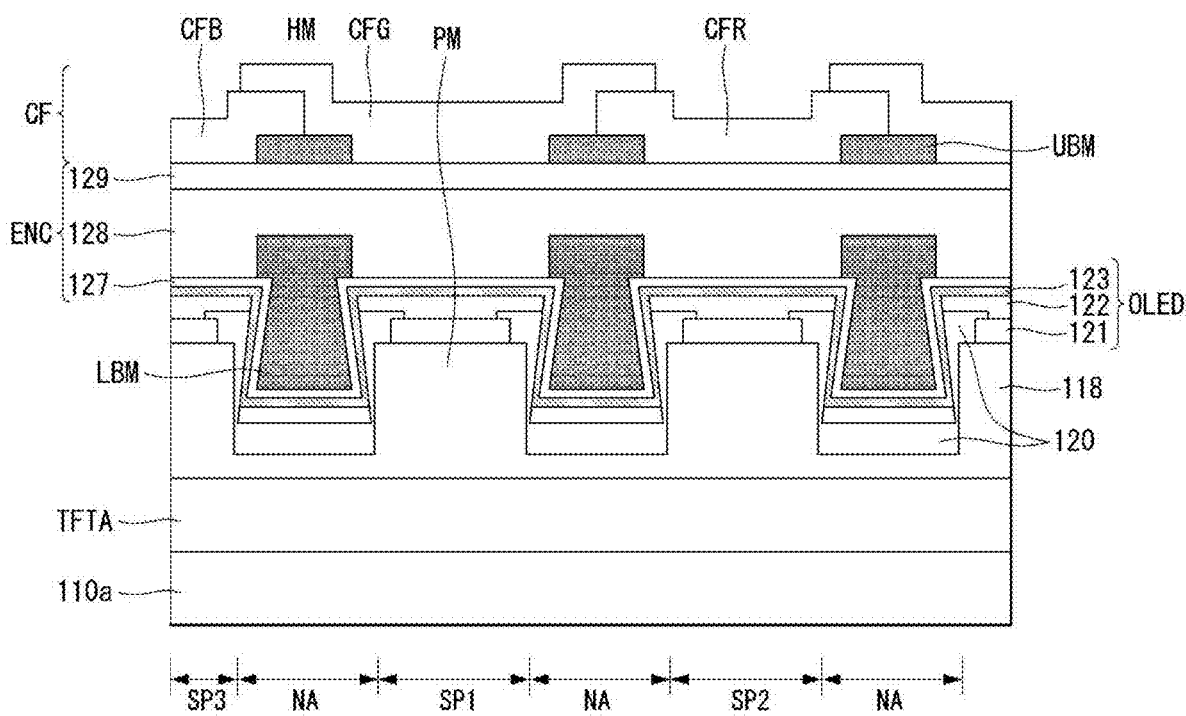
FIG. 23 is a fourth cross-sectional view of the display panel according to the second embodiment of the present disclosure.
Figure 24:
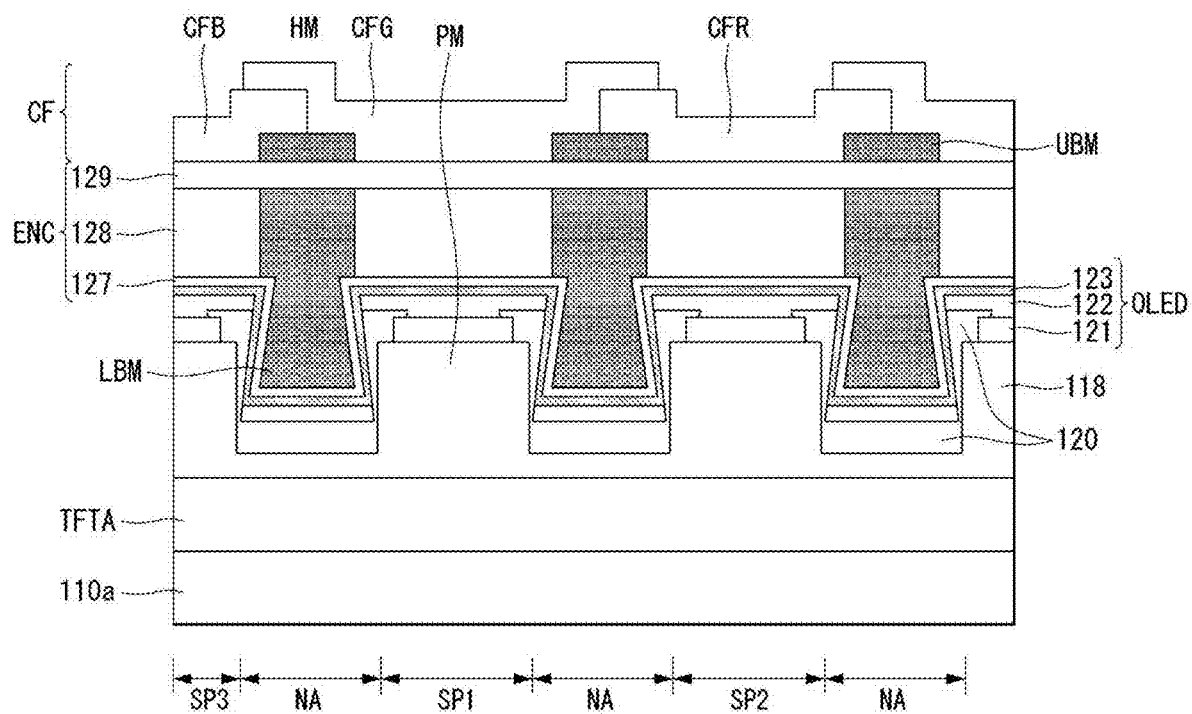
FIG. 24 is a fifth cross-sectional view of the display panel according to the second embodiment of the present disclosure.
Figure 25:
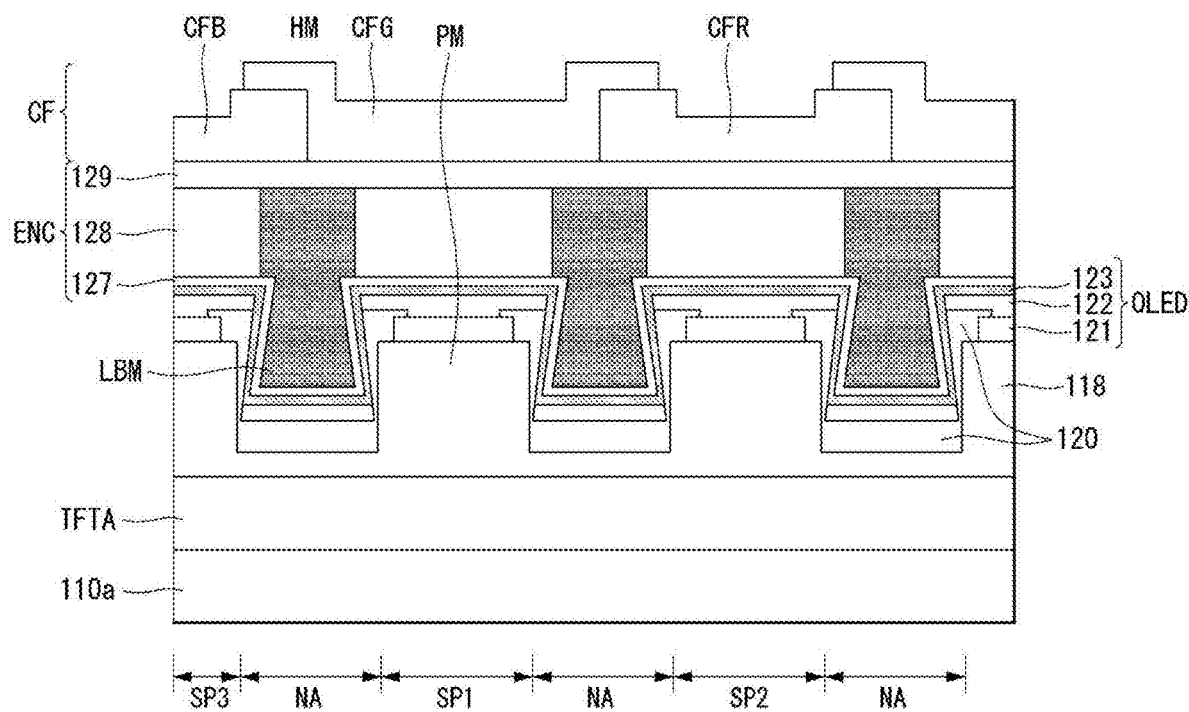
FIG. 25 is a sixth cross-sectional view of the display panel according to the second embodiment of the present disclosure.

FIG. 22 is a third cross-sectional view of the display panel according to the second embodiment of the present disclosure. FIG. 23 is a fourth cross-sectional view of the display panel according to the second embodiment of the present disclosure. FIG. 24 is a fifth cross-sectional view of the display panel according to the second embodiment of the present disclosure. FIG. 25 is a sixth cross-sectional view of the display panel according to the second embodiment of the present disclosure.

With reference to the example of FIG. 22, the first black matrix layer LBM may completely fill the depressions HM, e.g., may have a thickness corresponding to the surface of the first protection film layer 127 on the protrusions PM. Further, the first black matrix layer LBM may have a thickness corresponding to the surface of the common electrode layer 123 of the OLED (not shown). The FIG. 22 example shows a structure in which the first black matrix layer LBM is higher than the emission layer 122 to further improve the capability of blocking light paths or absorbing light as compared to the structures shown in the examples of FIGS. 16 and 17.

With reference to the example of FIG. 23, the first black matrix layer LBM may completely fill the depressions HM, and may protrude from the surface of the first protection film layer 127 on the protrusions PM. The FIG. 23 example shows a structure in which the first black matrix layer LBM is higher than the first protection film layer 127 to further improve the capability of blocking light paths or absorbing moving light as compared to the structure shown in the example of FIG. 22.

With reference to the example of FIG. 24, the first black matrix layer LBM may completely fill the depressions HM, and may protrude from the surface of the first protection film layer 127 on the protrusions PM, while having a height corresponding to the surface of the second protection film layer 128. The FIG. 24 example shows a structure in which the first black matrix layer LBM has a height corresponding to the surface of the second protection film layer 128 to further improve the capability of blocking light paths or absorbing light as compared to the structure shown in the example of FIG. 23.

With reference to the example of FIG. 25, when the first black matrix layer LBM has a height corresponding to the surface of the second protection film layer 128, the second black matrix layer UBM may be omitted, for example, because the first black matrix layer LBM can also execute the function of the second black matrix layer UBM, e.g., due to the thickness thereof.

With reference to the examples of FIGS. 22 to 25, the design of the first black matrix layer LBM may be changed in consideration of the waveguide phenomenon and color mixing caused thereby.

Embodiments of the present disclosure can reduce or prevent current leakage caused by pixel size decrease and definition increase, the waveguide phenomenon in which light moves to neighboring subpixels, and a problem of color mixing caused thereby. For example, embodiments of the present disclosure may be highly effective in reduction or or prevention of the waveguide phenomenon in which light moves to neighboring subpixels due to a refractive index difference between internal layers when a protection film layer is used, and a problem of color mixing caused by the waveguide phenomenon.

It will be apparent to those skilled in the art that various modifications and variations may be made in the present disclosure without departing from the technical idea or scope of the disclosure. Thus, it is intended that embodiments of the present disclosure cover the modifications and variations of the disclosure provided they come within the scope of the appended claims and their equivalents.

What is claimed is:

1. A light-emitting display device, comprising:
a first substrate;
an insulating layer on the first substrate, the insulating layer comprising depressions and protrusions;
a plurality of light-emitting diodes on the protrusions, the light-emitting diodes comprising a pixel electrode layer, an emission layer, a common electrode layer, and a black matrix layer in the depressions; and
a protection film layer on the common electrode layer corresponding to the depressions and the protrusions, the protection film layer comprising at least one layer;
wherein the black matrix layer is on the protection film layer inside the depressions.

2. The light-emitting display device of claim 1, wherein:
the protection film layer comprises first to third protection film layers; and
the black matrix layer is on the first protection film layer inside the depressions.

3. The light-emitting display device of claim 2, wherein the black matrix layer:
has a height corresponding to the surface of the protrusions; or
is higher than the surface of the protrusions.

4. The light-emitting display device of claim 2, wherein the height of the black matrix layer corresponds to:
the surface of the first protection film layer; or
the surface of the second protection film layer on the protrusions.

5. The light-emitting display device of claim 2, wherein at least one of the common electrode layer and the first protection film layer is formed along the topography of the protrusions and the depressions.

6. The light-emitting display device of claim 1, wherein each of the protrusions has a reverse-tapered or rectangular shape.

7. The light-emitting display device of claim 1, further comprising a bank layer covering an edge of the pixel electrode layer on the protrusions, sidewalls of the protrusions, and a surface of the insulating layer in the depressions.

8. The light-emitting display device of claim 7, wherein:
the bank layer covers the sidewalls of the protrusions, and becomes thinner with decreasing distance to the bottom of the protrusions; and
the sidewalls of the protrusions have a reverse-tapered shape according to the bank layer.

9. The light-emitting display device of claim 8, wherein:
the bank layer, the emission layer, and the common electrode layer are in the depressions; and
the emission layer on the protrusions is isolated from the emission layer on the depressions.

10. The light-emitting display device of claim 1, wherein:
the protection film layer comprises first to third protection film layers; and
the black matrix layer comprises:
a first black matrix layer on the first protection film layer in the depressions; and
a second black matrix layer on the third protection film layer.

11. The light-emitting display device of claim 10, wherein the second black matrix layer is disposed corresponding to the first black matrix layer.

12. The light-emitting display device of claim 10, further comprising a color filter layer on the third protection film layer.

13. The light-emitting display device of claim 1, wherein each of the light-emitting diodes is configured to emit at least one of: white light, red light, green light, and blue light.

14. A method of manufacturing a light-emitting display device, the method comprising:
providing a first substrate;
providing an insulating layer on the first substrate, the insulating layer comprising depressions and protrusions;
providing a plurality of light-emitting diodes on the protrusions, the providing the light-emitting diodes comprising a pixel electrode layer, an emission layer, a common electrode layer, and a black matrix layer in the depressions; and
providing a protection film layer on the common electrode layer corresponding to the depressions and the protrusions, the protection film layer comprising at least one layer,
wherein the black matrix layer is on the protection film layer inside the depressions.

15. The method of claim 14, wherein:
the protection film layer comprises providing first to third protection film layers; and
the black matrix layer is on the first protection film layer inside the depressions.

16. The method of claim 14, wherein each of the protrusions has a reverse-tapered or rectangular shape.

17. The method of claim 14, further comprising covering an edge of the pixel electrode layer on the protrusions, sidewalls of the protrusions, and a surface of the insulating layer in the depressions with a bank layer.

18. The method of claim 17, wherein:
the bank layer covers the sidewalls of the protrusions, and becomes thinner with decreasing distance to the bottom of the protrusions; and
the sidewalls of the protrusions have a reverse-tapered shape according to the bank layer.

19. The method of claim 18, wherein:
the bank layer, the emission layer, and the common electrode layer are in the depressions; and
the emission layer on the protrusions is isolated from the emission layer on the depressions.

* * * * *